(12) United States Patent
Nishikawa

(10) Patent No.: US 11,277,139 B2
(45) Date of Patent: Mar. 15, 2022

(54) PHASE CORRECTING DEVICE, DISTANCE MEASURING DEVICE, PHASE FLUCTUATION DETECTING DEVICE AND PHASE CORRECTION METHOD

(71) Applicants: Kabushiki Kaisha Toshiba, Tokyo (JP); Toshiba Electronic Devices & Storage Corporation, Tokyo (JP)

(72) Inventor: Masaki Nishikawa, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/018,039

(22) Filed: Sep. 11, 2020

(65) Prior Publication Data

US 2021/0297083 A1    Sep. 23, 2021

(30) Foreign Application Priority Data

Mar. 19, 2020  (JP) .............................. JP2020-049734

(51) Int. Cl.
*H03L 7/081* (2006.01)
*H03L 7/14* (2006.01)
(Continued)

(52) U.S. Cl.
CPC .......... *H03L 7/0814* (2013.01); *G01S 7/4008* (2013.01); *G01S 13/345* (2013.01); *H03L 7/146* (2013.01)

(58) Field of Classification Search
CPC ....... H03L 7/146; H03L 7/085; G01S 7/4008; G01S 13/345
See application file for complete search history.

(56) References Cited

U.S. PATENT DOCUMENTS 4,107,679 A * 8/1978 Strauch ................. G01S 13/341
342/122
4,219,770 A * 8/1980 Weinert ................. G01N 22/00
324/615

(Continued)

FOREIGN PATENT DOCUMENTS

| JP | 10-197627 A | 7/1998 |
| JP | 2001-272463 A | 10/2001 |

(Continued)

*Primary Examiner* — Adam D Houston
(74) *Attorney, Agent, or Firm* — Allen & Overy LLP

(57) ABSTRACT

A phase correcting device includes a local oscillator that includes an all digital phase-locked loop configured to output a local oscillation signal, a first phase detector configured to detect a phase of the local oscillation signal to output the phase of the local oscillation signal, a reference phase device configured to generate a quasi-reference phase corresponding to a reference phase of the local oscillation signal to output the quasi-reference phase, based on a reference clock, a second phase detector configured to detect a fluctuation amount of a phase of the local oscillator, based on the phase detected by the first phase detector and the quasi-reference phase, and a correction circuit configured to correct the phase of the inputted signal by using a detection result of the second phase detector.

8 Claims, 16 Drawing Sheets

(51) Int. Cl.
*G01S 13/34* (2006.01)
*G01S 7/40* (2006.01)

(56) References Cited

U.S. PATENT DOCUMENTS

| | | | | |
|---|---|---|---|---|
| 7,068,110 | B2* | 6/2006 | Frey | H03L 7/0891 |
| | | | | 327/147 |
| 7,332,972 | B2* | 2/2008 | Vandel | H03L 7/0893 |
| | | | | 331/17 |
| 7,529,533 | B2* | 5/2009 | Bellantoni | H04B 1/30 |
| | | | | 455/334 |
| 8,284,099 | B2* | 10/2012 | Sakurai | G01S 13/345 |
| | | | | 342/200 |
| 8,339,165 | B2* | 12/2012 | Dunworth | H03L 7/085 |
| | | | | 327/152 |
| 8,937,572 | B2* | 1/2015 | Kobayashi | H03L 7/093 |
| | | | | 342/199 |
| 8,982,974 | B2* | 3/2015 | Bogdan | H04L 27/2675 |
| | | | | 375/260 |
| 9,057,775 | B2* | 6/2015 | Kobayashi | G01S 13/345 |
| 10,305,611 | B1* | 5/2019 | Rimini | G01S 13/343 |
| 10,520,596 | B2* | 12/2019 | Kurashige | G01S 7/35 |
| 10,541,691 | B1* | 1/2020 | Kossel | H03L 7/0814 |
| 2005/0258908 | A1* | 11/2005 | Mitric | H03L 7/143 |
| | | | | 331/16 |
| 2007/0153951 | A1* | 7/2007 | Lim | H03L 7/085 |
| | | | | 375/376 |
| 2008/0233954 | A1* | 9/2008 | Ibrahim | H03L 7/181 |
| | | | | 455/434 |
| 2009/0256601 | A1* | 10/2009 | Zhang | H03L 7/089 |
| | | | | 327/156 |
| 2010/0245160 | A1 | 9/2010 | Sakurai et al. | |
| 2012/0242538 | A1* | 9/2012 | Hasch | G01S 7/354 |
| | | | | 342/194 |
| 2014/0162573 | A1* | 6/2014 | Laskar | H04W 52/0209 |
| | | | | 455/73 |
| 2015/0318860 | A1* | 11/2015 | Wang | H03L 7/0891 |
| | | | | 327/157 |
| 2016/0020775 | A1* | 1/2016 | Kuo | H03L 7/095 |
| | | | | 327/159 |
| 2018/0254882 | A1* | 9/2018 | Bogdan | H03L 7/0995 |
| 2018/0267154 | A1* | 9/2018 | Ootaka | G01S 13/36 |
| 2018/0267155 | A1* | 9/2018 | Shimizu | G01S 7/4912 |
| 2019/0227141 | A1* | 7/2019 | Nishikawa | G01S 13/84 |
| 2020/0114875 | A1* | 4/2020 | Stitt | H04B 17/318 |
| 2020/0309941 | A1* | 10/2020 | Makari | H04W 4/48 |
| 2021/0078537 | A1* | 3/2021 | Ootaka | B60R 25/30 |
| 2021/0088646 | A1* | 3/2021 | Ootaka | G01S 13/38 |
| 2021/0281267 | A1* | 9/2021 | Nishikawa | G01S 13/345 |
| 2021/0297083 | A1* | 9/2021 | Nishikawa | G01S 7/2923 |

FOREIGN PATENT DOCUMENTS

| | | |
|---|---|---|
| JP | 3366615 B2 | 1/2002 |
| JP | 2010-237172 A | 10/2010 |
| JP | 2018-155724 A | 10/2018 |

* cited by examiner

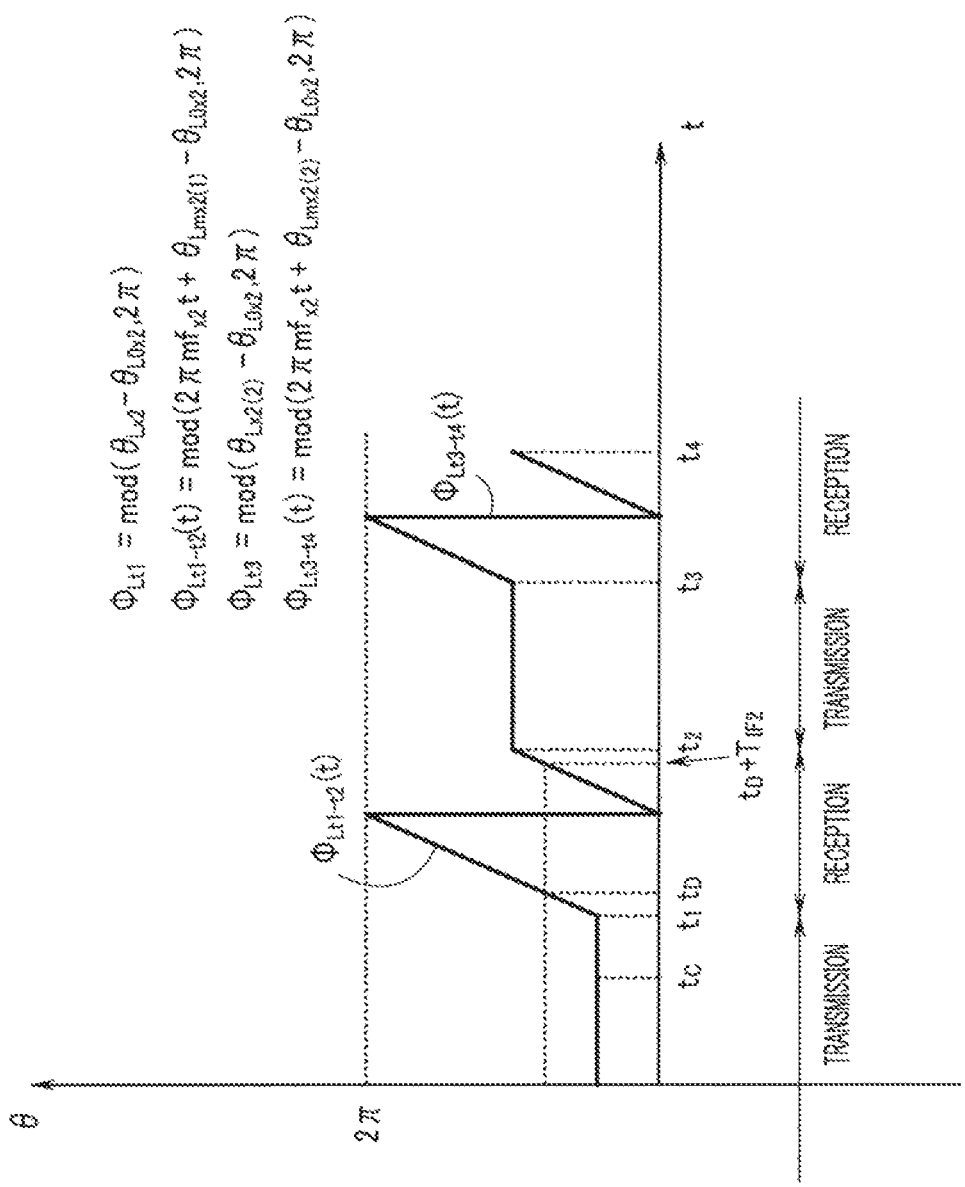

PHASE CORRECTING DEVICE, DISTANCE MEASURING DEVICE, PHASE FLUCTUATION DETECTING DEVICE AND PHASE CORRECTION METHOD

CROSS REFERENCE TO RELATED APPLICATION

This application is based upon and claims the benefit of priority from the prior Japanese Patent Application No. 2020-049734 filed in Japan on Mar. 19, 2020; the entire contents of which are incorporated herein by reference.

FIELD

An embodiment described herein relates generally to a phase correcting device, a distance measuring device, a phase fluctuation detecting device and a phase correction method.

BACKGROUND

In recent years, keyless entry systems that make it easy to lock and unlock cars have been adopted by many automobiles. According to the technique, a user of an automobile can lock and unlock doors by using communication between a key of the automobile and the automobile. Further, in recent years, a smart key system that allows a user to lock and unlock a door or start an engine without touching a key has also been widely used.

However, there have been many cases where an attacker who carries out a so-called relay attack invades the communication between a key and an automobile, and steals a vehicle or articles in the vehicle. Therefore, as a defense measure against the aforementioned attack (so-called relay attack), a measure for measuring the distance between the key and the automobile, and prohibiting the control of the vehicle by communication when the distance is determined to be a predetermined distance or more is being studied.

There are a time detection method, a frequency difference detection method, a phase detection method and the like, as distance measurement methods, but due to the ease of implementation, a distance measuring system is receiving attention which employs a communication type phase detection method that obtains the distance between respective devices by communication between the respective devices. However, since reference signals between the respective devices independently operate, the initial phases differ from each other, and therefore distance measurement accuracy is generally greatly deteriorated in the communication type phase detection method. Therefore, there is proposed the technique that enables distance measurement by transmitting phase information detected in one device to the other device. According to the proposal, it is possible to calculate a highly accurate distance by performing a predetermined operation by using phase information of the signals detected by receiving units of two distance measuring devices that form a pair.

Note that in the proposal, accurate distance measurement is enabled on the precondition that the initial phase does not fluctuate in the local oscillator in the distance measuring device.

Since the distance measuring device is also mounted on a key side, there is a demand for extending the battery life of the key, and low power consumption of the distance measuring device is required. Since most of the power consumption of the distance measuring device is consumed by wireless units, reduction in power consumption of the wireless units is required. The power consumption of the wireless units strongly depends on the architecture of the wireless units. A configuration using a digital-controlled oscillator (DCO) direct modulation method (hereinafter, also referred to as a DCO direct modulation method) for a transmission unit, and a super-heterodyne (SH) method (hereinafter, also referred to as an SH method) or a Low-IF reception method for a reception unit is widely known as a configuration of low power consumption. Therefore, it is desired to realize a distance measuring device by the configuration using a DCO direct modulation method for the transmission unit, and using an SH method for the reception unit.

However, when distance measurement is performed by using a DCO direct modulation method for the transmission unit, and using an SH method for the reception unit, the initial phase fluctuates in the local oscillator in the distance measuring device. Therefore, accurate distance measurement cannot be performed with the distance measuring device using a DCO direct modulation method for the transmission unit, and using an SH method for the reception unit.

Note that the fluctuation of the initial phase in the local oscillator may have an adverse effect on not only the distance measuring device but also various devices that detect the phases of the signals inputted by using the local oscillator.

BRIEF DESCRIPTION OF THE DRAWINGS

FIG. 16 is an explanatory diagram similar to the explanatory diagram in FIG. 14.

DETAILED DESCRIPTION

A phase correcting device of an embodiment includes a local oscillator that includes an all digital phase-locked loop configured to generate a local oscillation signal based on a reference clock, and is configured to give the local oscillation signal to a device configured to detect a phase of an inputted signal, a first phase detector included in the all digital phase-locked loop, and configured to detect a phase of the local oscillation signal to output the phase of the local oscillation signal, a reference phase device configured to generate a quasi-reference phase corresponding to a reference phase of the local oscillation signal at a time of an initial setting of the local oscillator to output the quasi-reference phase, based on the reference clock, a second phase detector configured to detect a fluctuation amount of a phase of the local oscillator, based on the phase detected by the first phase detector and the quasi-reference phase, and a correction circuit configured to correct the phase of the inputted signal by using a detection result of the second phase detector.

Hereinafter, the embodiment of the present invention will be described with reference to the drawings.

Embodiment

Figure 1:
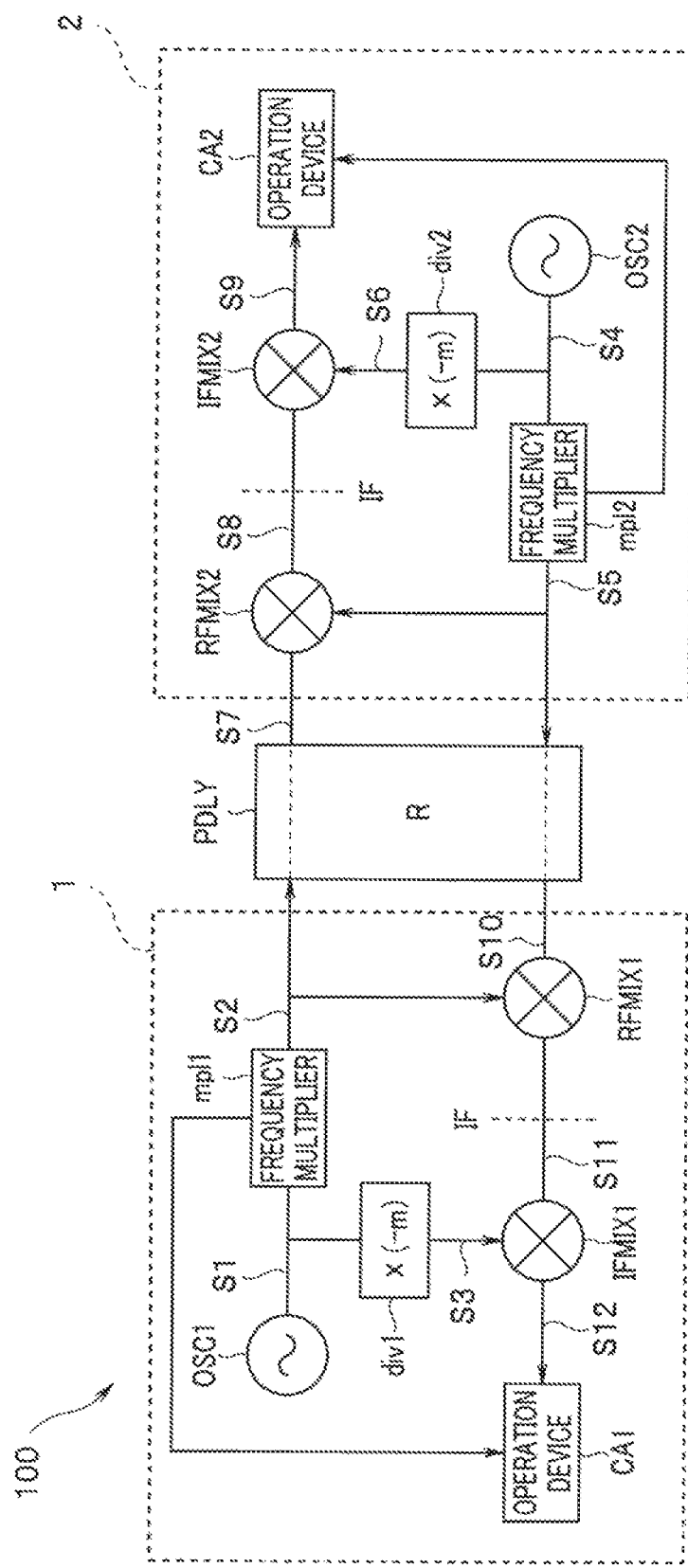
FIG. 1 is a block diagram illustrating a distance measuring system configured by distance measuring devices each including a phase fluctuation detecting device and a phase correcting device according to an embodiment.

FIG. 1 is a block diagram illustrating a distance measuring system configured by distance measuring devices each including a phase fluctuation detecting device and a phase correcting device according to the embodiment. Distance measurement obtaining a distance between a device 1 and a device 2 is enabled by performing transmission and reception of a single wave signal between the devices 1 and 2 in FIG. 1. Note that the single wave signal is a signal of a single frequency such as an unmodulated carrier.

In the present embodiment, an example in which the phase fluctuation detecting device and the phase correcting device are applied to the distance measuring device is explained, but it is also possible to apply the phase fluctuation detecting device and the phase correcting device to various devices that detect phases of inputted signals other than the distance measuring device. For example, application to a positioning device is also possible.

Figure 2:
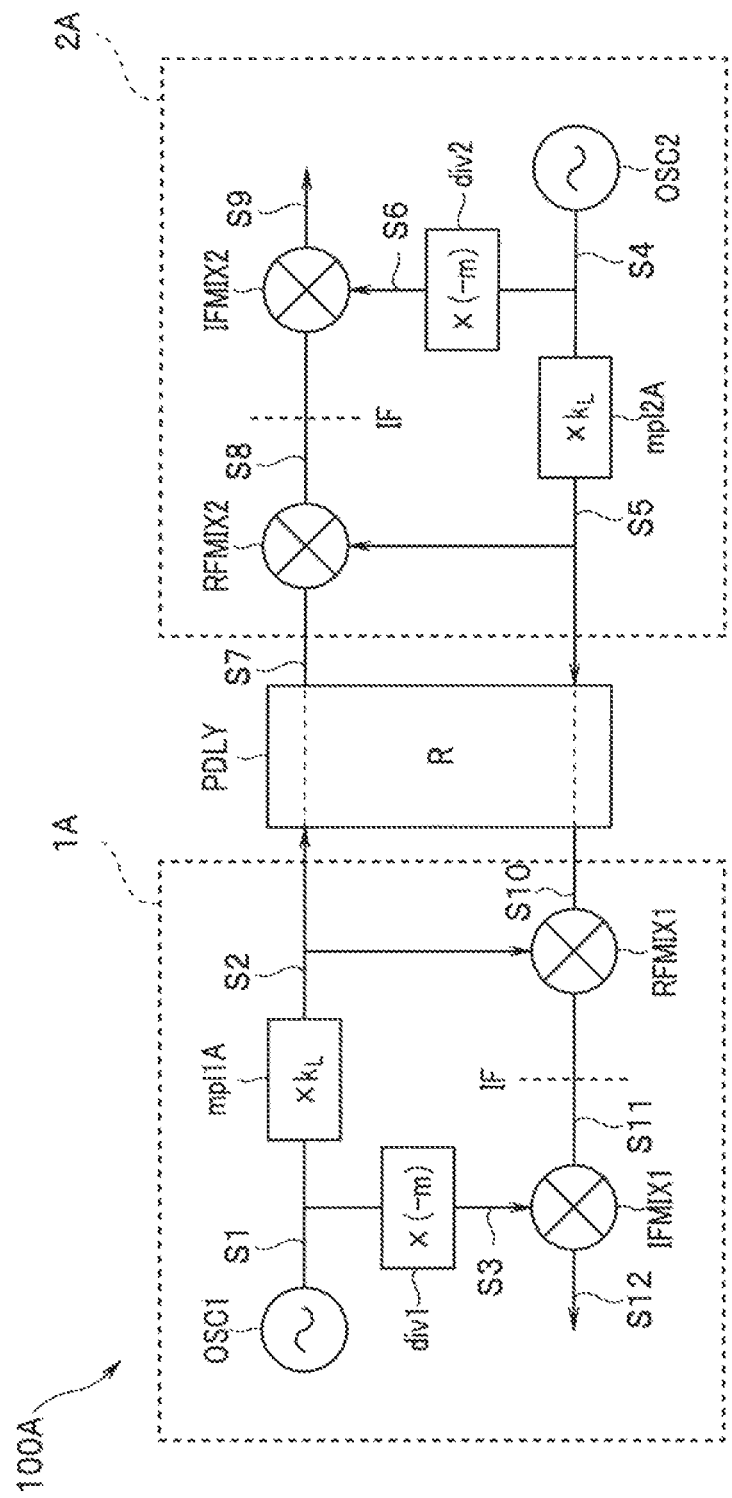
FIG. 2 is a configurational diagram of a wireless circuit of a distance measuring system in a related art that carries out distance measurement between two devices by a communication type phase detection method.

FIG. 2 is a configurational diagram of a wireless circuit of a distance measuring system in a related art that performs distance measurement between two devices by a communication type phase detection method. In FIG. 1 and FIG. 2, same components are assigned with same reference signs, and redundant explanation will be omitted for the same components.

First, with reference to FIG. 2, a reason why accurate measurement cannot be performed even when phase information of signals detected by reception units of two distance measuring devices that form a pair is used with distance measuring devices each of a related art using a digital-controlled oscillator (DCO) direct modulation method for a transmission unit, and using a super heterodyne (SH) method for a reception unit will be described. Further, FIG. 3 to FIG. 6 are diagrams for explaining operations in the devices in FIG. 2.

A distance measuring system 100A includes a device 1A and a device 2A. At least one of the device 1A and the device 2A is movable. In the distance measuring system 100A, a distance between the device 1A and the device 2A is calculated based on carrier phase detection. A case where one of the device 1A and the device 2A calculates the distance based on phase information acquired by the device 1A and the device 2A will be considered.

The device 1A transmits a first distance measurement signal (single wave signal), and the device 2A transmits a second distance measurement signal (single wave signal). The first and the second distance measurement signals reach the device 2A and the device 1A respectively via a propagation path PDLY between the device 1A and the device 2A. The device 1A and the device 2A each include a wireless circuit using a DCO direct modulation method of low power consumption for a transmission unit, and using an SH method of low power consumption for a reception unit.

FIG. 2 illustrates a configuration of simplified wireless units of the device 1A and the device 2A. The device 1A includes an oscillator (OSC1) peculiar to the device, a frequency multiplier (mpl1A), an RF frequency converter (RFMIX1), a frequency divider (div1), and an intermediate (IF) frequency converter (IFMIX1). The device 2A also includes a wireless architecture similar to the device 1A, and includes an oscillator (OSC2) peculiar to the device, a frequency multiplier (mpl2A), an RF frequency converter (RFMIX2), a frequency divider (div2), and an intermediate (IF) frequency converter (IFMIX2). Note that in the devices 1A and 2A, output signals of mpl1A and mpl2A become transmission signals of the devices 1A and 2A, and are also used as local signals (LO signals). In other words, mpl1A and mpl2A respectively configure local oscillators.

Hereinafter, in order to clarify a problem, the device 1A and the device 2A are assumed to set transmission frequencies first of all. In other words, in an initial setting, for example, the transmission frequencies of the devices 1A and 2A are respectively set at frequencies obtained by multiplying the oscillation frequencies of OSC1 and OSC2 by a predetermined multiple $k_L$.

An output signal (oscillation signal) S1 ($=lo_{x1}$) of OSC1 of the device 1A can be expressed by equation (1) as follows with a frequency of an oscillation signal of OSC1 set as $f_{x1}$ and an initial phase set as $\theta_{x1}$.

$$lo_{x1} = \sin(2\pi f_{x1}t + \theta_{x1}) \tag{1}$$

The oscillation frequency of OSC1 is multiplied by $k_L$ by mpl1A. A phase $\phi_{tx1}$ of an output signal S2 of mpl1A is expressed as $$\phi_{tx1} = 2\pi k_L f_{x1} t + \theta_{Lx1} \tag{2}.$$

Here, $\theta_{Lx1}$ is an initial phase of the output signal S2 of mpl1A. An output of mpl1A is generally generated by a digitally controlled oscillator (DCO) technique and a digital frequency/phase synchronization technique. Note that in mpl1A using a TDC (time to digital converter) for a phase synchronizing unit, $\theta_{Lx1} = k_L \theta_{x1}$ is not generally established.

Therefore, in equation (2) described above, an initial phase of the output S2 of mpl1A is defined as $\theta_{Lx1}$.

For the device 2A, a similar transmission frequency setting is also performed. An output signal S4 (=$lo_{x2}$) of OSC2 of the device 2A can be expressed by equation (3) as follows with a frequency of an oscillation signal of OSC2 set as $f_{x2}$, and an initial phase set as $\theta_{x2}$.

$$lo_{x2}=\sin(2\pi f_{x2}t+\theta_{x2}) \quad (3)$$

In mpl2A, the oscillation frequency of OSC2 is multiplied by $k_L$. A phase $\phi_{tx2}$ of an output signal S5 of mpl2A is expressed as $$\phi_{tx2}=2\pi k_L f_{x2}t+\theta_{Lx2} \quad (4).$$

Here, $\theta_{Lx2}$ is an initial phase of the output of mpl2A. For the output of mpl2A, $\theta_{Lx2}=k_L\theta_{x2}$ is not generally established, either, as in the output of mpl1A. Therefore, in equation (4) described above, the initial phase of the output of mpl2A is defined as $\theta_{Lx2}$.

Patent Literature 1 discloses that in the case of a system of TDD (time division duplex) that does not simultaneously carry out transmission and reception, correct distance measurement can be performed by performing exchange of single wave signals between the device 1A and the device 2A. Note that the devices in Patent Literature 1 differ from the devices in FIG. 2 in configuration of the wireless units. Patent Literature 1 shows that distance measurement can be correctly performed by adopting a distance measurement sequence of "8 alternations" that repeats transmission and reception of four times each in total between the devices 1A and 2A by each using two single-wave signals. Transmitting and receiving while changing the frequency like this is enabled by changing settings of mpl1A and mpl2A in the devices 1A and 2A.

Figure 3:
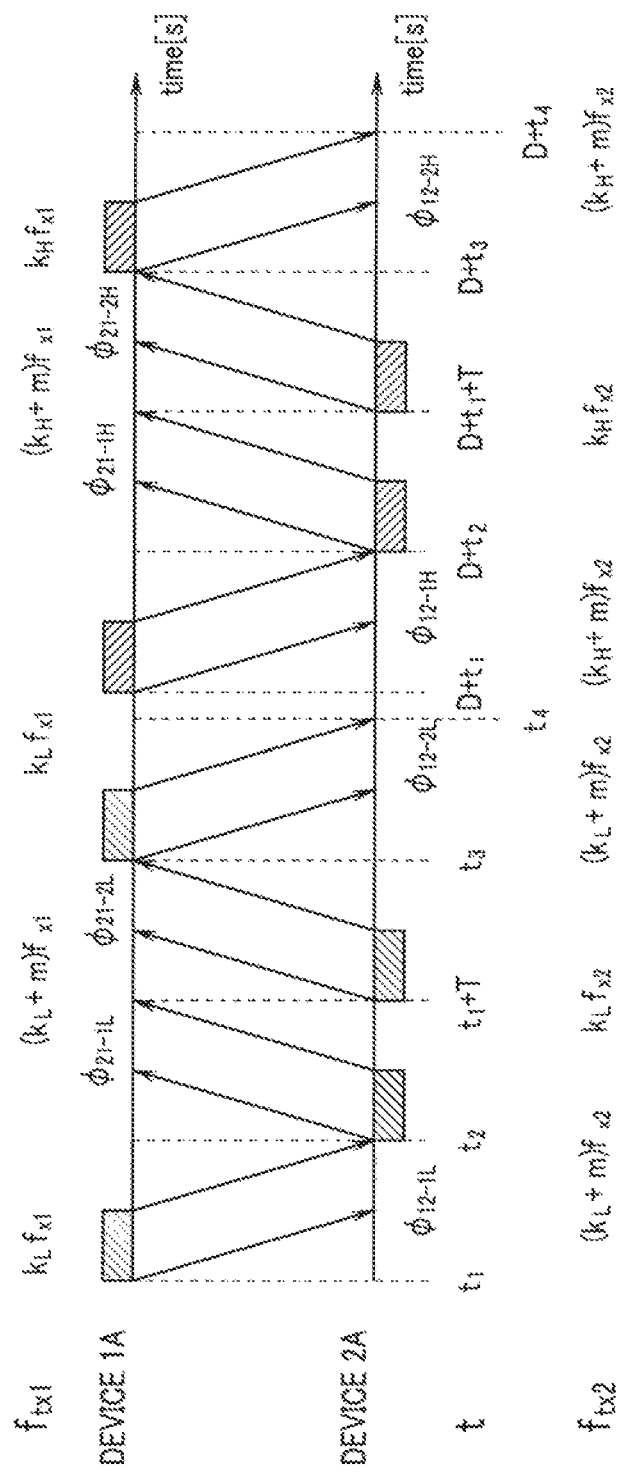
FIG. 3 is an explanatory diagram illustrating an "8 alternations" distance measuring sequence in a case where the distance measuring devices each using a DCO direct modulation method for a transmission unit, and a heterodyne method for a reception unit.

FIG. 3 illustrates an example of an "8 alternations" distance measurement sequence in a case where the distance measuring devices each using a DCO direct modulation method for the transmission unit, and a heterodyne method for the reception unit are employed. Explaining an order of alternations by paying attention to transmission signals regarding the distance measurement sequence in FIG. 3, the order is as follows. The device 1A transmits signals of a frequency $k_L f_{x1}$ at times t=$t_1$, and t=$t_3$, and transmits signals of frequency $k_H f_{x1}$ at times D+$t_1$, and D+$t_3$. The device 2A transmits a signal of a frequency $k_L f_{x2}$ twice from a time $t_2$, and transmits a signal of frequency $k_H f_{x2}$ twice from a time D+$t_2$.

The device 1A and the device 2A perform transmission after the frequencies of the transmission signals are respectively set at $k_L f_{x1}$ and the frequency of $k_L f_{x2}$ (hereinafter, these frequencies are also referred to as low frequencies) in the initial setting. When only transmission of the devices 1A and 2A is considered, a single wave signal of the frequency $k_L f_{x1}$ is transmitted from the device 1A to the device 2A first, and the device 2A receives the single wave signal of the frequency $k_L f_{x1}$ from the device 1A. FIG. 3 shows that transmission is performed at the time $t_1$ after it takes a predetermined time period for the device 1A to be set to transmit the single wave signal of the frequency $k_L f_{x1}$ to the device 2A.

Next, after it takes a predetermined time period for the device 2A to be set to transmit the single wave signal of the frequency $k_L f_{x2}$ to the device 1A, transmission of the single wave signal is performed twice at the time $t_2$. Furthermore, a single wave signal of the frequency $k_L f_{x1}$ is transmitted from the device 1A to the device 2A again, and the device 2A receives the single wave signal of the frequency $k_L f_{x1}$ from the device 1A. The device 1 takes a predetermined time period for the transmission, and performs transmission at the time $t_3$. The signal exchanges end at a time $t_4$.

Figure 4:
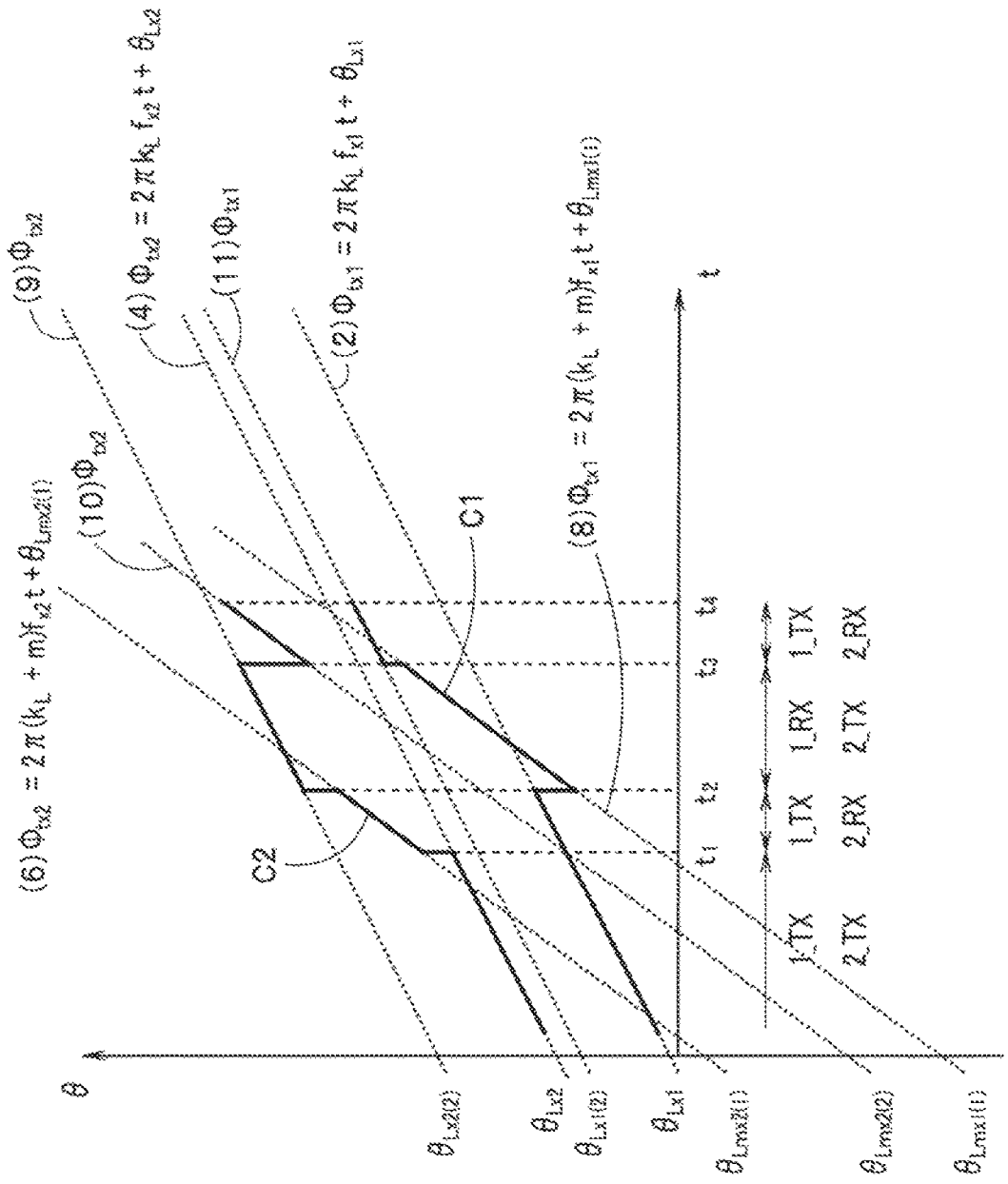
FIG. 4 is a graph illustrating changes of phases of signals S2 and S5 in the "8 alternations" distance measuring sequence, by plotting a time in a horizontal axis, and plotting a phase θ in a vertical axis.

FIG. 4 is a graph illustrating changes in phases of the signals S2 and S5 in the "8 alternations" distance measurement sequence, with a time plotted in a horizontal axis and a phase θ plotted in a vertical axis. Note that numbers shown in parentheses in FIG. 4 correspond to numbers of equations in the description. In the initial phases shown in the vertical axis in FIG. 4, L included in subscripts indicates that the single wave signal has a low frequency, x1 indicates the initial phase of the signal S2, x2 indicates the initial phase of the signal S5, m indicates a case of multiplying the frequency by ($k_L$+m), and numbers in subscript parentheses of the phases θ in FIG. 4 correspond to orders of a change in frequency from the frequency of the initial setting without parentheses. In the description, the same subscripts will be used hereinafter, and H of a subscript in each of signs indicating the initial phases of the signals S2 and S5 indicates that the single wave signal has a high frequency.

A dashed straight line (2) in FIG. 4 represents a phase $\phi_{tx1}$ of the output signal S2 of mpl1A of the device 1A, and a dashed straight line (4) represents a phase $\phi_{tx2}$ of the output signal S5 of a mpl2A of the device 2A. The phase $\phi_{tx1}$ has a linear characteristic having an inclination of $2\pi K_L f_{x1}$ with the initial phase as $\theta L_{x1}$. The phase $\phi_{tx2}$ has a linear characteristic having an inclination of $2\pi K_L f_{x2}$ with the initial phase as $\theta_{Lx2}$.

However, in the distance measuring device in FIG. 2 using a DCO direct modulation method and a heterodyne method, it is necessary to change the frequencies of the transmission signals of mpl1A and mpl2A at a transmission time and a reception time.

Figure 5:
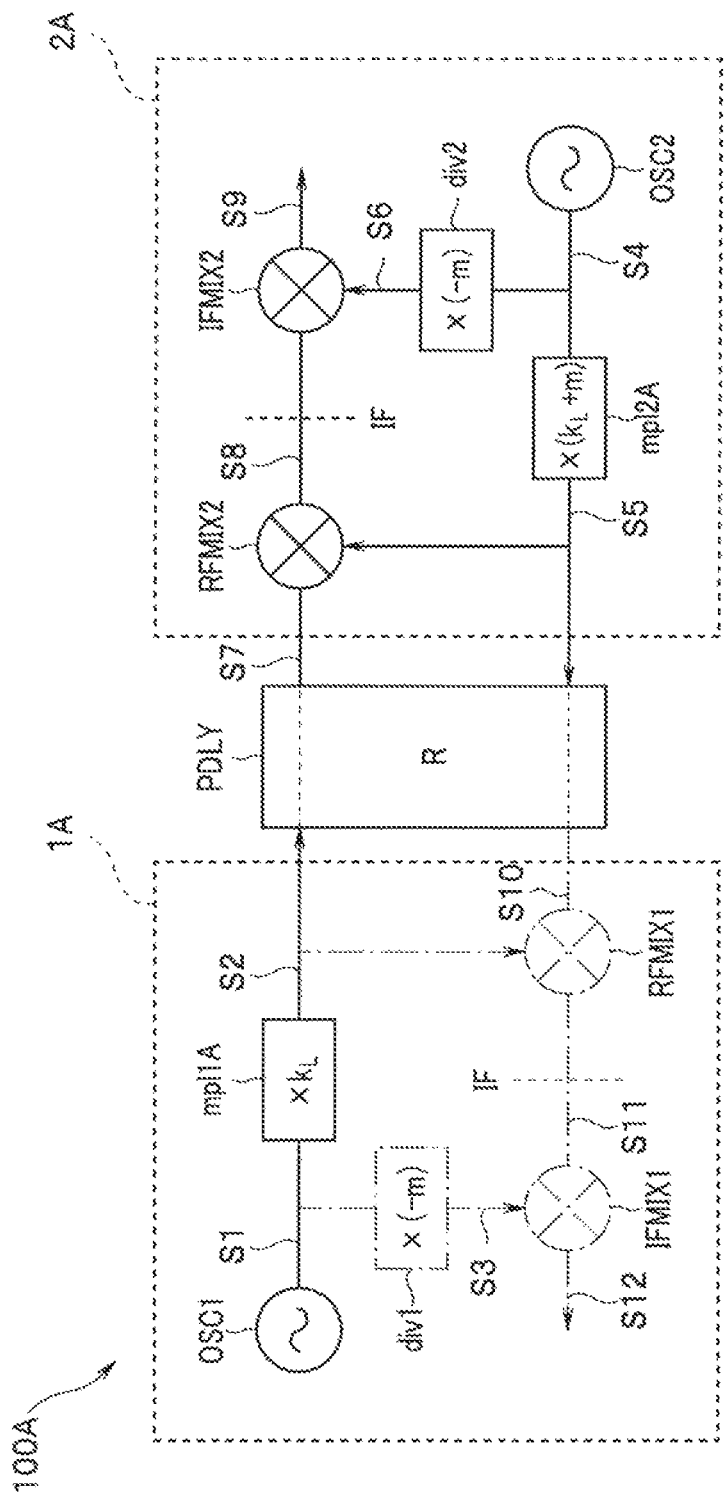
FIG. 5 is an explanatory diagram illustrating settings of a device 1A and a device 2A between a time $t_1$ and a time $t_2$ of FIG. 3.

FIG. 5 is an explanatory diagram illustrating settings of the device 1A and the device 2A between the time $t_1$ and the time $t_2$ in FIG. 3. Note that in a period between the times $t_1$ and $t_2$, a reception operation of the device 1A is not performed, and therefore unnecessary units for operation are shown by dash-dotted lines.

In the heterodyne method, a reception signal is converted into an IF frequency. In an example of FIG. 5, RFMIX2 of the device 2A needs to convert a reception signal into an IF frequency of approximately $-mf_{x2}$. For this reason, in the device 2A that receives a single wave signal of the frequency $k_L f_{x1}$ from the device 1A, a frequency of the local signal (LO signal) S5 from mpl2A which is given to RFMIX2 is set at ($k_L$+m) $f_{x2}$ instead of $k_L f_{x2}$. The reception signal that is converted into the IF frequency has frequency converted by the IF frequency converter (IFMIX2), and an output signal S9 of a base band is obtained. An output signal S4 of OSC2 is frequency-divided to a signal S6 having a frequency obtained by multiplying the output signal S4 by m by div2, and the signal S6 is used as an LO signal for IFMIX2. A phase $\phi_{b2}$ of the signal S6 is expressed by equation (5) as follows.

$$\phi_{b2}=-m2\pi f_{x2}t+\theta_{Bx2} \quad (5)$$

Here, $\theta_{Bx2}$ is an initial phase of the LO signal for IFMIX2 from div 2, and the frequency $-mf_{x2}$ is an IF frequency.

In order to receive a signal from the device 1A in the device 2A, the phase $\phi_{tx2}$ of the output signal S5 of mpl2A is set at what is shown by equation (6) as follows that is obtained by transforming equation (4) described above.

$$\phi_{tx2}=2\pi(k_L+m)f_{x2}t+\theta_{Lmx2(1)} \quad (6)$$

Here, $\theta_{Lmx2(1)}$ is an initial phase of the output signal S5 of mpl2A between the time $t_1$ and the time $t_2$. Note that it is not necessary to change the frequency of mpl1A in the device 1A, and therefore the phase $\phi_{tx1}$ of the output signal S2 of mpl1A remains as in equation (2).

Figure 6:
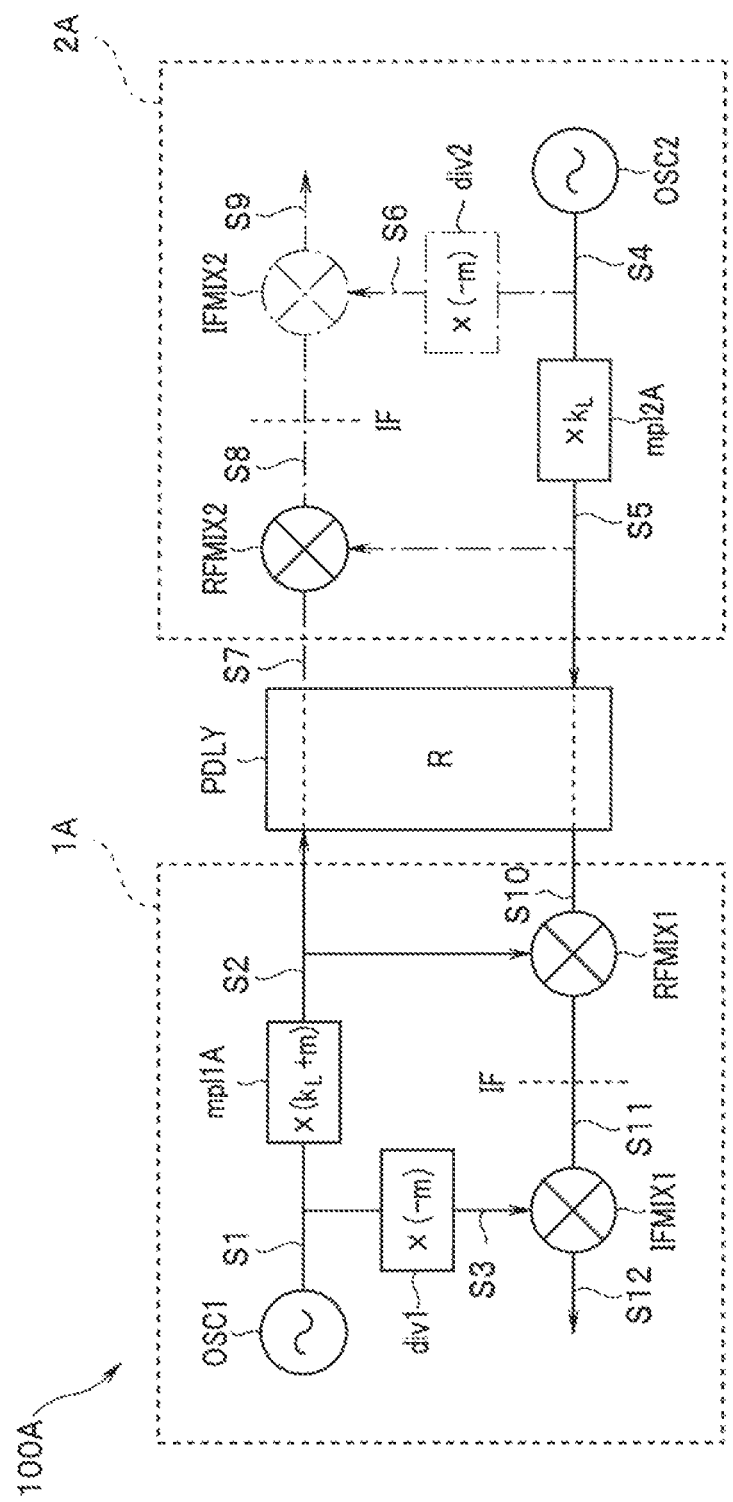
FIG. 6 is a diagram for explaining operations in the devices of FIG. 2.

FIG. 6 is an explanatory diagram illustrating settings of the device 1A and the device 2A between the time $t_2$ and the time $t_3$ in FIG. 3. Note that in a period between the time $t_2$ and the time $t_3$, a reception operation of the device 2A is not performed, and therefore unnecessary units for operation are shown by dash-dotted lines.

In the device 1A that adopts a heterodyne method, RFMIX1 needs to convert a reception signal into an IF frequency of approximately $-mf_{x1}$. For this reason, in the device 1A that receives a single wave signal of the frequency $k_L f_{x2}$ from the device 2A, the frequency of the local signal (LO signal) S2 from mpl1A which is given to RFMIX1 is set at $(k_L+m) f_{x1}$ instead of $k_L f_{x1}$. The reception signal that is converted into the IF frequency has frequency converted by the IF frequency converter (IFMIX1), and an output signal S12 is obtained. An output signal S1 of OSC1 is frequency-divided to a signal S3 having a frequency obtained by multiplying an output signal S1 of OSC1 by $-m$ by div1, and the signal S3 is used as an LO signal for IFMIX1. A phase $\phi_{b1}$ of the signal S3 is expressed by equation (7) as follows.

$$\phi_{b1} = -m 2\pi f_{x1} t + \theta_{Bx1} \quad (7)$$

Here, $\theta_{Bx1}$ is an initial phase of the LO signal for IFMIX1 from div1, and the frequency $-mf_{x1}$ is an IF frequency.

In order to receive a signal from the device 2A, in the device 1A, the phase $\phi_{tx1}$ of the output signal S2 of mpl1A is set at what is shown by equation (8) as follows that is obtained by transforming equation (2) described above.

$$\phi_{tx1} = 2\pi(k_L+m)f_{x1}t + \theta_{Lmx1(1)} \quad (8)$$

Here, $\theta_{Lmx1(1)}$ is an initial phase of the output signal S2 of mpl1A between the time $t_2$ and the time $t_3$.

The device 2A returns the setting of the transmission frequency from $(k_L+m) f_{x2}$ to $k_L f_{x2}$ in a period between the time $t_2$ and the time $t_3$. At this time, the phase $\phi_{tx2}$ of the output signal S5 of mpl2A is expressed by equation (9) as follows. Note that $\theta_{Lx2(2)}$ is an initial phase of the signal S5 in this case.

$$\phi_{tx2} = 2\pi k_L f_{x2} t + \theta_{Lx2(2)} \quad (9)$$

Settings of the device 1A and the device 2A are same as the settings in FIG. 5, between the time $t_3$ and the time $t_4$ that are in a next sequence. In the device 2A, in order to receive a single wave signal of the frequency $k_L f_{x1}$ from the device 1A, the frequency of the LO signal (signal SS) given to RFMIX2 is changed from $k_L f_{x2}$ to $(k_L+m) f_{x2}$. Note that in this case, the phase $\phi_{b2}$ of the LO signal (signal S6) for IFMIX2 given to IFMIX2 is the same as in equation (5) described above.

The phase $\phi_{tx2}$ of the output signal S5 of mpl2A of the device 2A is given by equation (10) as follows obtained by transforming equation (9) described above.

$$\phi_{tx2} = 2\pi(k_L+m)f_{x2}t + \theta_{Lmx2(2)} \quad (10)$$

Here, $\theta_{Lmx2(2)}$ is the initial phase of the output signal S5 of mpl2A between the time $t_3$ and the time $t_4$.

The device 1A returns the transmission frequency from $(k_L+m) f_{x1}$ to $k_L f_{x1}$. At this time, the phase $\phi_{tx1}$ of the output signal S2 of mpl1A is set at what is shown by equation (11) as follows.

$$\phi_{tx1} = 2\pi k_L f_{x1} t + \theta_{Lx1(2)} \quad (11)$$

Here, $\theta_{Lx1(2)}$ is the initial phase of the output signal S2 of mpl1A between the time $t_3$ and the time $t_4$.

In this way, between the time $t_1$ and the time $t_4$, the phase $\phi_{tx1}$ of the signal S2 of mpl1A changes as shown by a thick line characteristic C1 in FIG. 4, and the phase $\phi_{tx2}$ of the signal S5 of mpl2A changes as shown by a thick line characteristic C2 in FIG. 4.

From a time $D+t_1$ to a time $D+t_4$ in FIG. 3, a single wave signal of the frequency of $k_H f_{x1}$ is transmitted from the device 1A, and a single wave signal of the frequency of $k_H f_{x2}$ is outputted from the device 2A. Hereinafter, these frequencies are also referred to as high frequencies. A sequence in this case only differs from the above sequence in that $k_L$ is changed to $k_H$ in FIG. 5 and FIG. 6, and therefore explanation will be omitted.

Next, referring to FIG. 5, a phase $\phi_{BB2L(T12)}(t)$ of the base band signal S9 detected in the device 2A between the time $t_1$ and the time $t_2$ is obtained while phases of mpl1A and mpl2A are considered. A phase $\phi_{rx2}$ of a signal S7 after passing through the propagation path PDLY is expressed by equation (12) as follows.

$$\phi_{rx2} = 2\pi k_L f_{x1}(t-\tau_R) + \theta_{Lx1} \quad (12)$$

Here, $\tau_R$ is a delay time of a propagation path length R. The signal S7 is frequency-converted by using the signal S5 (LO signal). From equation (12) and equation (6), a phase $\phi_{ifx2(T12)}(t)$ of an output signal S8 of RFMIX2 is expressed by equation (13) as follows.

$$\phi_{ifx2(T12)}(t) = 2\pi k_L(f_{x1}-f_{x2})t - 2\pi m f_{x2} t + (\theta_{Lx1} - \theta_{Lmx2(1)}) - 2\pi k_L f_{x1} \tau_R \quad (13)$$

Note that equation (13) shows a phase result of extracting only a desired signal. The signal is frequency-converted by using the signal S6. Accordingly, from equation (13) and equation (5), the phase $\phi_{BB2L(T12)}(t)$ of the signal S9 detected in the device 2A is what is expressed by equation (14) as follows.

$$\phi_{BB2L(T12)}(t) = 2\pi k_L(f_{x1}-f_{x2})t + (\theta_{Lx1} - \theta_{Lmx2(1)}) - \theta_{Bx2} - 2\pi k_L f_{x1} \tau_R \quad (14)$$

Note that equation (14) shows a result of performing desired quadrature demodulation.

Similarly, with reference to FIG. 5, a phase of the signal S9 detected in the device 2A between the time $t_3$ and the time $t_4$ is obtained. From equation (11), the phase of the signal S7 after passing through the propagation path PDLY is expressed by $$\phi_{rx2} = 2\pi k_L f_{x1}(t-\tau_R) + \theta_{Lx1(2)} \quad (15)$$

from equation (11). The signal S7 is frequency-converted by the signal S5 (LO signal). From equation (15) and equation (10), a phase $\phi_{ifx2(T34)}(t)$ of an output signal S8 of RFMIX2 is expressed by equation (16) as follows.

$$\phi_{ifx2(T34)}(t) = 2\pi k_L(f_{x1}-f_{x2})t - 2\pi m f_{x2} t + (\theta_{Lx1(2)} - \theta_{Lmx2(2)}) - 2\pi k_L f_{x1} \tau_R \quad (16)$$

Note that equation (16) shows a phase result of extracting only a desired signal. The signal is frequency-converted by using the signal S6. From equation (16) and equation (5), a phase $\phi_{BB2L(T34)}(t)$ of the signal S9 detected in the device 2A is $$\phi_{BB2L(T34)}(t) = 2\pi k_L(f_{x1}-f_{x2})t + (\theta_{Lx1(2)} - \theta_{Lmx2(2)}) - \theta_{Bx2} - 2\pi k_L f_{x1} \tau_R \quad (17)$$

Note that equation (17) describes a result of performing desired quadrature demodulation.

Next, with reference to FIG. 6, a phase of the signal S12 detected in the device 1A between the time $t_2$ and the time $t_3$ is obtained. A phase $\phi_{rx1}$ of a signal S10 after passing through the propagation path PDLY is given by equation (18) as follows from equation (9) described above.

$$\phi_{rx1}=2\pi k_L f_{x2}(t-\tau_R)+\theta_{Lx2(2)} \quad (18)$$

The signal S10 is frequency-converted by using the signal S2 (LO signal) in RFMIX1. From equation (18) and equation (8), a phase $\phi_{ifx1(T23)}$ (t) of an output signal S11 of RFMIX1 is expressed by equation (19) as follows.

$$\phi_{ifx1(T23)}(t)=2\pi k_L(f_{x2}-f_{x1})t-2\pi m f_{x1}t+(\theta_{Lx2(2)}-\theta_{Lmx1(1)})-2\pi k_L f_{x2}\tau_R \quad (19)$$

Note that equation (19) shows a phase result of extracting only a desired signal. The signal S11 is frequency-converted by using the signal S3. As a result, a phase $\phi_{BB2L(T23)}$ (t) of the signal S9 detected in the device 2A is expressed by equation (20) as follows from equation (19) and equation (7).

$$\phi_{BB2L(T23)}(t)=2\pi k_L(f_{x2}-f_{x1})t+(\theta_{Lx2(2)}-\theta_{Lmx1(1)})-\theta_{Bx1}-2\pi k_L f_{x2}\tau_R \quad (20)$$

Note that equation (20) describes a result that a desired quadrature modulation is performed.

Patent Literature 1 shows that a distance can be obtained by addition of the phases of the reception signals obtained by the distance measurement sequence. In the example of FIG. 3, an addition result $\phi_{BBLSUM}$ (t) of four phases is expressed by equation (21) as follows when the four phases of reception signals obtained in transmission and reception of single wave signals of a low frequency from the time $t_1$ to the time $t_4$ are respectively $\phi_{12-1L}$, $\phi_{21-1L}$, $\phi_{21-2L}$, and $\phi_{12-2L}$.

$$\phi_{BBLSUM}(t)=\phi_{12-1L}+\phi_{21-1L}+\phi_{21-2L}+\phi_{12-2L} \quad (21)$$

When an interval between the time $t_2$ and the time $t_1$ and an interval to between the time $t_4$ and the time $t_3$ are defined as $$t_0=t_2-t_1=t_4-t_3 \quad (22),$$

and a time interval from a time at which a first distance measurement signal is transmitted from the device 1A to a time at which a second distance measurement signal is transmitted from the device 2A is set as T, the four-phase addition result of equation (21) is as shown in equation (23) as follows.

$$\phi_{BBLSUM}(t)=\phi_{BB2L(T12)}(t)+\phi_{BB2L(T23)}(t+t_0)+\phi_{BB2L(T23)}(t+T)+\phi_{BB2L(T34)}(t+t_0+T) \quad (23)$$

Equation (14), equation (17) and equation (20) described above are substituted into equation (23) described above, and thereby equations (24) and (25) as follows are obtained.

$$\phi_{BBLSUM}(t)=4\pi k_L(f_{x1}+f_{x2})\tau_R-2(\theta_{Bx1}+\theta_{Bx2})+\theta_{LSUM} \quad (24)$$

$$\theta_{LSUM}=(\theta_{Lx1}-\theta_{Lmx2(1)})+2\times(\theta_{Lx2(2)}-\theta_{Lmx1(1)})+(\theta_{Lx1(2)}-\theta_{Lmx2(2)}) \quad (25)$$

When a delay $\tau_R$ is obtained from equation (24) described above, the delay $\tau_R$ corresponding to a distance between devices is what is shown by equation (26) as follows.

$$\tau_R=(\theta_{Bx1}+\theta_{Bx2})0/\{2\pi k_L(f_{x1}+f_{x2})\}-\theta_{LSUM}/\{4\pi k_L(f_{x1}+f_{x2})\}+\phi_{BBLSUM}(t)/\{4\pi k_L(f_{x1}+f_{x2})\} \quad (26)$$

A third term of equation (26) described above is the addition result of the four phases, and is obtained by measurement. However, the other terms are difficult to detect. Accordingly, correct distance measurement cannot be performed with four alternations of single wave signals of a low frequency.

In the distance measurement sequence in FIG. 3, the devices 1A and 2A carry out a sequence using single wave signals of a high frequency following the low frequency transmission. The high-frequency sequence is same as the low-frequency sequence, but a difference lies in changing the frequency setting parameter $k_L$ to $k_H$. Important equations for analysis will be shown as follows.

Between a time D+$t_1$ and a time D+$t_2$, the device 2A receives a single wave signal of a frequency $k_H f_{x1}$ from the device 1A. A phase $\phi_{BB2H(T12)}$ (t) of a signal S7 received by the device 2A is expressed by equation (27) as follows.

$$\phi_{BB2H(T12)}(t)=2\pi k_H(f_{x1}-f_{x2})t(\theta_{Hx1}-\theta_{Hmx2(1)})-\theta_{Bx2}-2\pi k_H f_{x1}\tau_R \quad (27)$$

Note that $\theta_{Hx1}$ is an initial phase of the signal S2 of the frequency $k_H f_{x1}$ of the device 1A, and $\theta_{Hmx2(1)}$ is an initial phase of the signal S5 of a frequency $(k_H+m)f_{x2}$ of the device 2A.

Between a time D+$t_2$ and a time D+$t_3$, the device 1A receives a single wave signal of a frequency $k_H f_{x2}$ from the device 2A. A phase $\phi_{BB2H(T23)}$ (t) of the signal S10 received by the device 1A is expressed by equation (28) as follows.

$$\phi_{BB2H(T23)}(t)=2\pi k_H(f_{x2}-f_{x1})t(\theta_{Hx2(2}-\theta_{Hmx1(1)})-\theta_{Bx1}-2\pi k_H f_{x2}\tau_R \quad (28)$$

Note that $\theta_{Hx2(2)}$ is an initial phase of the signal S5 of the frequency $k_H f_{x2}$ of the device 2A, and $\theta_{Hmx1(1)}$ is an initial phase of the signal S2 of the frequency $(k_H+m)f_{x1}$ of the device 1A.

Between a time D+$t_3$ and a time D+$t_4$, the device 2A receives a single wave signal of a frequency $k_H f_{x1}$ from the device 1A. A phase $\phi_{BB2H(T34)}$ (t) of the signal S7 received by the device 2A is expressed by equation (29) as follows.

$$\phi_{BB2H(T34)}(t)=2\pi k_H(f_{x1}-f_{x2})t+(\theta_{Hx1(2)}-\theta_{Hmx2(2)})-\theta_{Bx2}-2\pi k_H f_{x1}\tau_R \quad (29)$$

Note that an initial phase $\theta_{Hx1(2)}$ is an initial phase of the signal S2 of the frequency $k_H f_{x1}$ of the device 1A, and $\theta_{Hmx2(2)}$ is the initial phase of the signal S5 of the frequency $(k_H+m)f_{x2}$ of the device 2A.

In the example of FIG. 3, an addition result $\phi_{BBHSUM}$ (t) of four phases is expressed by equation (30) as follows when the four phases of reception signals obtained in transmission and reception of single wave signals of a high frequency from the time D+$t_1$ to the time D+$t_4$ are respectively $\phi_{12-1H}$, $\phi_{21-1H}$, $\phi_{21-2H}$, and $\phi_{12-2H}$.

$$\phi_{BBHSUM}(t)=\phi_{12-1H}+\phi_{21-1H}+\phi_{21-2H}+\phi_{12-2H} \quad (30)$$

When equation (22) and the information on the time T are added to equation (30) described above, equation (31) as follows is obtained.

$$\phi_{BBHSUM}(t)=\phi_{BB2H(T12)}(t)+\phi_{BB2H(T23)}(t+t_0)+\phi_{BB2H(T23)}(t+T)+\phi_{BB2H(T34)}(t+T+t_0) \quad (31)$$

When equation (31) is transformed by using equation (27), equation (28), and equation (29), equation (32) and equation (33) as follows are obtained.

$$\phi_{BBHSUM}(t)=-4\pi k_H(f_{x1}+f_{x2})\tau_R-2(\theta_{Bx1}+\theta_{Bx2})+\theta_{HSUM} \quad (32)$$

$$\theta_{HSUM}=(\theta_{Hx1}-\theta_{Hmx2(1)})+2\times(\theta_{Hx2(2)}-\theta_{Hmx1(1)})+(\theta_{Hx1(2)}-\theta_{Hmx2(2)}) \quad (33)$$

When the delay $\tau_R$ corresponding to the distance between the devices is made a subject of equation (33), equation (34) as follows is obtained.

$$\tau_R=(\theta_{Bx1}+\theta_{Bx2})/\{2\pi k_H(f_{x1}+f_{x2})\}-\theta_{HSUM}/\{4\pi k_H(f_{x1}+f_{x2})\}+\phi_{BBHSUM}(t)/\{4\pi k_H(f_{x1}+f_{x2})\} \quad (34)$$

A third term of equation (34) is the addition result of the four phases, and can be detected by measurement. However, the other terms are difficult to detect. Accordingly, correct distance measurement cannot be performed with transmission and reception of four alternations by single wave signals of a high frequency.

Next, distance measurement using two waves of a low frequency and a high frequency is considered. In other words, the delay $\tau_R$ is obtained by performing subtraction of equation (23) and equation (31) described above. Equation (35) as follows is obtained by subtraction of equation (23) and equation (31).

$$\phi_{BBLSUM}(t) - \phi_{BBHSUM}(t) = 4\pi(k_H - k_L)(f_{x1} + f_{x2})\tau_R + \theta_{LSUM} - \theta_{HSUM} \quad (35)$$

From equation (35), the delay $\tau_R$ is obtained by equation (36) as follows.

$$\tau_R = -(\theta_{LSUM} - \theta_{HSUM})/4\pi(k_H - h_L)(f_{x1} + f_{x2}) + (\phi_{BBLSUM}(t) - \phi_{BBHSUM}(t))/4\pi(k_H - k_L)(f_{x1} + f_{x2}) \quad (36)$$

A second term of equation (36) is a value that is obtained by an operation of the phases of the received single wave signals, that is, a measurement value. However, a first term in equation (36) shows addition and subtraction of the initial phases of the signals S2 and S5 of the devices 1A and 2A that are expressed by equation (25) and equation (33). The initial phases of the signals S2 and S5 are as shown in FIG. 4 in the distance measurement sequence in FIG. 3. In the proposal of Patent Literature 1, accurate distance measurement is possible by cancelling components of the initial phase by using the condition that the initial phase does not change in the distance measurement sequence. However, when a DCO direct modulation method and a heterodyne method are used, the initial phase changes each time the frequency setting is changed as in FIG. 4, so that the first term of equation (36) described above cannot be obtained, and the propagation delay time $\tau_R$ cannot be accurately calculated. Since a distance can be calculated by multiplying the propagation delay time period by a light velocity, the distance cannot be accurately calculated in other words.

Note that the above described explanation shows the problem that the distance measurement cannot be accurately performed due to the fluctuations of the initial phases of the output signals of mpl1A and mpl2A that are local oscillators in the distance measuring devices. However, it is conceivable that not only the distance measuring device but also various devices that detect the phases of signals by using local oscillators may not be able to achieve desired functions due to fluctuation in the initial phases of the output signals. The present embodiment is applicable to the various devices that detect the phases of signals by using the local oscillators like this.

Correction Method of Initial Phase That Fluctuates

In the present embodiment, it is made possible to achieve a same function as in a case where an initial phase is not changed, in a device using local oscillators, by adopting a reference phase device for obtaining a phase (hereinafter, referred to as a reference phase) that changes according to a frequency at an initial setting time from an initial phase at a time of occurrence of a frequency of initial setting, that, is, an initial phase before performing resetting of the frequency, obtaining a fluctuation amount of the phase by an initial phase change and a frequency change by obtaining a difference between the reference phase and the phase after resetting of the frequency, and correcting the phase according to the obtained fluctuation amount.

Distance Measuring Device

In FIG. 1, devices 1 and 2 that are distance measuring devices each have a configuration using a digital-controlled oscillator (DCO) direct modulation method for a transmission unit, and using a super heterodyne (SH) method for a reception unit. A distance measuring system 100 of the present embodiment includes the device 1 and the device 2, and at least one of the device 1 and the device 2 is movable. The device 1 transmits a first distance measurement signal (single wave signal), and the device 2 transmits a second distance measurement signal (single wave signal). The first and the second distance measurement signals respectively reach the device 2 and the device 1 via the propagation path PDLY between the device 1 and the device 2.

In FIG. 1, the device 1 has an oscillator (OSC1) peculiar to the device, a frequency multiplier (mpl1), an RF frequency converter (RFMIX1), a frequency divider (div1), and an intermediate (IF) frequency converter (IFMIX1). The device 2 has a same configuration as the configuration of the device 1, and has an oscillator (OSC2) peculiar to the device, a frequency multiplier (mpl2), an RF frequency converter (RFMDC2), a frequency divider (div2), and an intermediate (IF) frequency converter (IFMIX2).

In other words, a main point where the devices 1 and 2 respectively differ from the devices 1A and 2A in FIG. 2 is that the devices 1 and 2 respectively adopt mpl1 and mpl2 in place of mpl1A and mpl2A. In mpl1 and mpl2, respective outputs are also used as local signals (LO signal). In other words, mpl1 and mpl2 respectively configure local oscillators.

An LO signal similar to the LO signal of mpl1A or mpl2A can be generated by each of mpl1 and mpl2. Accordingly, in the present embodiment, the distance measurement sequence illustrated in FIG. 3 can also be carried out, and equation (36) described above obtaining the delay $\tau_R$ corresponding to the distance between the devices is established. The present embodiment enables accurate distance measurement by obtaining the value of the first term of equation (36) described above by adopting mpl1 and mpl2.

Figure 7:
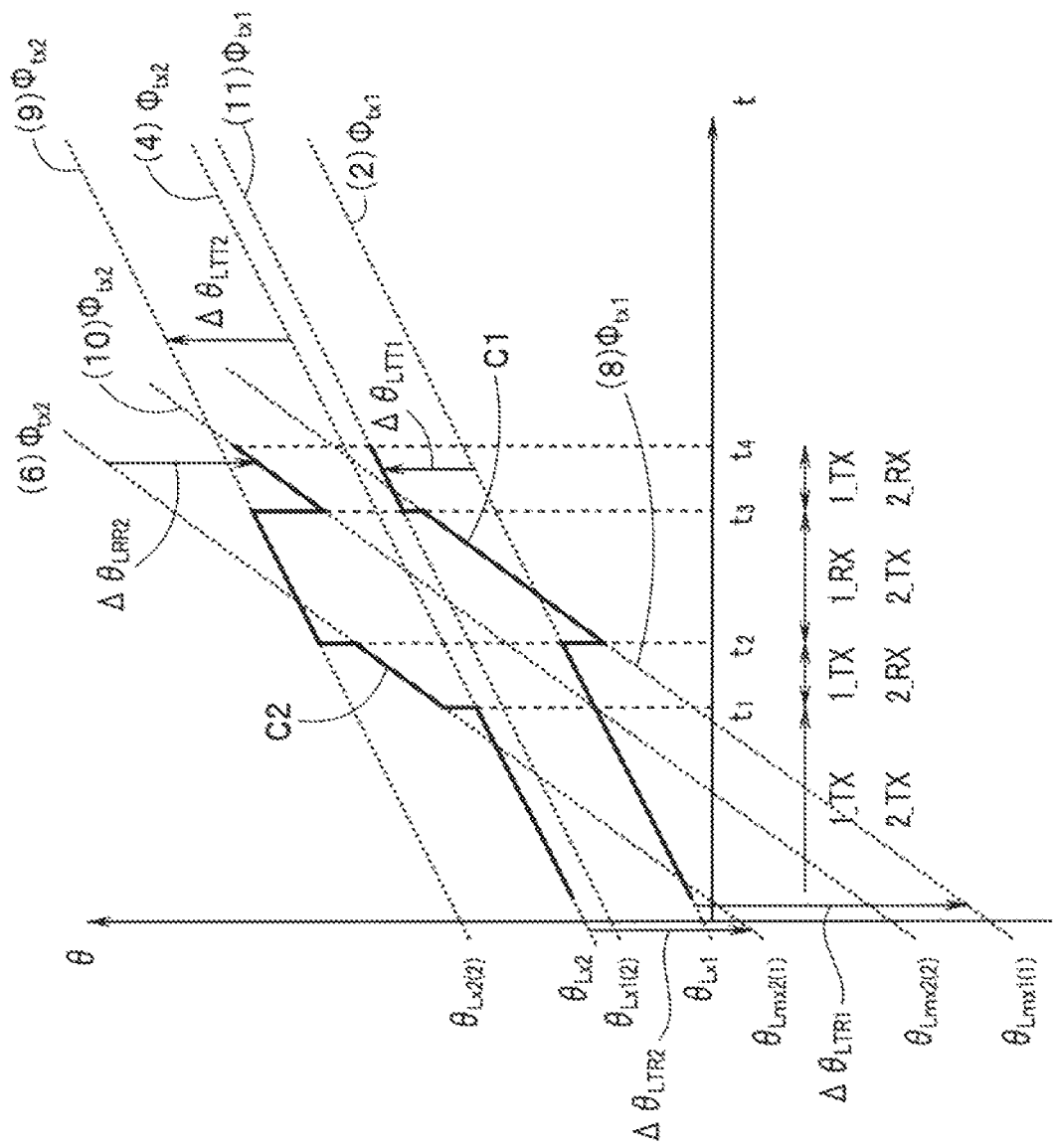
FIG. 7 is a diagram in which arrows explaining information on five kinds of phase differences are added to a graph similar to the graph of FIG. 4.

First, with reference to a graph in FIG. 7, three kinds of phase differences that are necessary to calculate the first term of equation (36) described above will be described. FIG. 7 is a diagram in which arrows explaining information on the five kinds of phase differences are added to a graph similar to the graph in FIG. 4. Note that in FIG. 7 and FIG. 8 described later, TT included in subscripts in signs indicating the five kinds of phase differences indicates that a phase difference is related to a fluctuation in a phase of a signal, the frequency of which is multiplied by $k_L$, RR indicates that a phase difference is related to a fluctuation in a phase of a signal, the frequency of which is multiplied by $(k_L+m)$, and TR indicates that a phase difference is related to changes of the phase of the signal, the frequency of which is multiplied by $k_L$, and the phase of the signal, the frequency of which is multiplied by $(k_L+m)$. Further, L included in the subscripts in the signs indicating the phase differences indicates that the single wave signal has a low frequency, H indicates that a single wave signal has a high frequency, 1 indicates that a phase difference is related to the signal S2, and 2 indicates that a phase difference is related to the signal S5.

As described above, the devices 1 and 2 perform initial settings of transmission frequencies by the time $t_1$ in FIG. 3. In other words, the device 1 and the device 2 respectively have the transmission frequencies set at $k_L f_{x1}$ and $k_L f_{x2}$ by mpl1 and mpl2. Explaining the distance measurement sequence in the low frequency in FIG. 3 again, the initial phase of the output signal S2 of mpl1 of the device 1 changes to an initial phase $\theta_{Lx1}$ before the time $t_2$, an initial phase $\theta_{Lmx1(1)}$ from the time $t_2$ to the time $t_3$, and an initial phase $\theta_{Lx1(2)}$ from the time $t_3$ to the time $t_4$. As for the device 2, the initial phase of the output signal S5 of mpl2 changes to an initial phase $\theta_{Lx2(2)}$ before the time $t_1$, an initial phase $\theta_{Lmx2(1)}$ from the time $t_1$ to the time $t_2$, an initial phase $\theta_{Lx2(2)}$ from the time $t_2$ to the time $t_3$, and an initial phase $\theta_{Lmx2(2)}$ from the time $t_3$ to the time $t_4$.

Phase differences $\Delta\theta_{LTT1}$ and $\Delta\theta_{LTR1}$ are phase differences concerning the device 1. The phase difference $\Delta\theta_{LTT1}$ is a difference between the initial phase $\theta_{Lx1(2)}$ from the time $t_3$ to the time $t_4$ and the initial phase $\theta_{Lx1}$ before the time $t_2$ in the signal S2. The phase difference $\Delta\theta_{LTR1}$ is a difference between the initial phase $\theta_{Lmx1(1)}$ from the time $t_2$ to the time $t_3$ and the initial phase $\theta_{Lx1}$ before the time $t_2$. Relationships among these variables can be respectively expressed by equation (37) and equation (38).

$$\theta_{Lx1(2)} = \theta_{Lx1} + \Delta\theta_{LTT1} \quad (37)$$

$$\theta_{Lmx1(1)} = \theta_{Lx1} + \Delta\theta_{LTR1} \quad (38)$$

Further, phase differences $\Delta\theta_{LTT2}$, $\Delta\theta_{LRR2}$, and $\Delta\theta_{LTR2}$ are phase differences concerning the device 2. The phase difference $\Delta\theta_{LTT2}$ is a difference between the initial phase $\theta_{Lx2(2)}$ from the time $t_2$ to the time $t_3$ and the initial phase $\theta_{Lx2}$ before the time $t_1$ in the signal S5. The phase difference $\Delta\theta_{LRR2}$ is a difference between the initial phase $\theta_{Lmx2(2)}$ from the time $t_3$ to the time $t_4$ and the initial phase $\theta_{Lmx2(1)}$ from the time $t_1$ to the time $t_2$ in the signal S5. The phase difference $\Delta\theta_{LTR2}$ is a difference between the initial phase $\theta_{Lmx2(1)}$ from the time $t_1$ to the time $t_2$ and the initial phase $\theta_{Lx2}$ before the time $t_1$ in the signal S5. Relationships among these variables can be respectively expressed by equation (39) to equation (41) as follows.

$$\theta_{Lx2(2)} = \theta_{Lx2} + \Delta\theta_{LTT2} \quad (39)$$

$$\theta_{Lmx1(1)} = \theta_{Lx2} + \Delta\theta_{LTR2} \quad (40)$$

$$\theta_{Lmx2(2)} = \theta_{Lmx2(1)} + \Delta\theta_{LRR2} = \theta_{Lx2} + \Delta\theta_{LTR2} + \Delta\theta_{LRR2} \quad (41)$$

As will be described later, of the phase differences, $\Delta\theta_{LTT1}$, $\Delta\theta_{LTT2}$, and $\Delta\theta_{LRR2}$ can be directly measured by mpl1 and mpl2. On the other hand, $\Delta\theta_{LTR1}$ in equation (38) and $\Delta\theta_{LTR2}$ in equation (40) cannot be directly measured. Therefore, in the present embodiment, mpl1 and mpl2 obtain $\Delta\theta_{LTR1}$ and $\Delta\theta_{LTR2}$ by measuring the phase differences relating to $\Delta\theta_{LTR1}$ and $\Delta\theta_{LTR2}$ as will be described later.

Here, in order to show a concept of an initial phase measurement method, $\Delta\theta_{LTR1}$ and $\Delta\theta_{LTR2}$ will be described as measurable.

When equation (37) to equation (41) described above are substituted into $\theta_{LSUM}$ in equation (25) described above, $\theta_{LSUM}$ in equation (36) described above is given by equation (42) as follows.

$$\theta_{LSUM} = -2(\Delta\theta_{LTR1} + \Delta\theta_{LTR2}) + 2 \times \Delta\theta_{LTT2} + \Delta\theta_{LTT1} - \Delta\theta_{LRR2} \quad (42)$$

Next, $\theta_{HSUM}$ in the high frequency shown in equation (33) is obtained.

Figure 8:
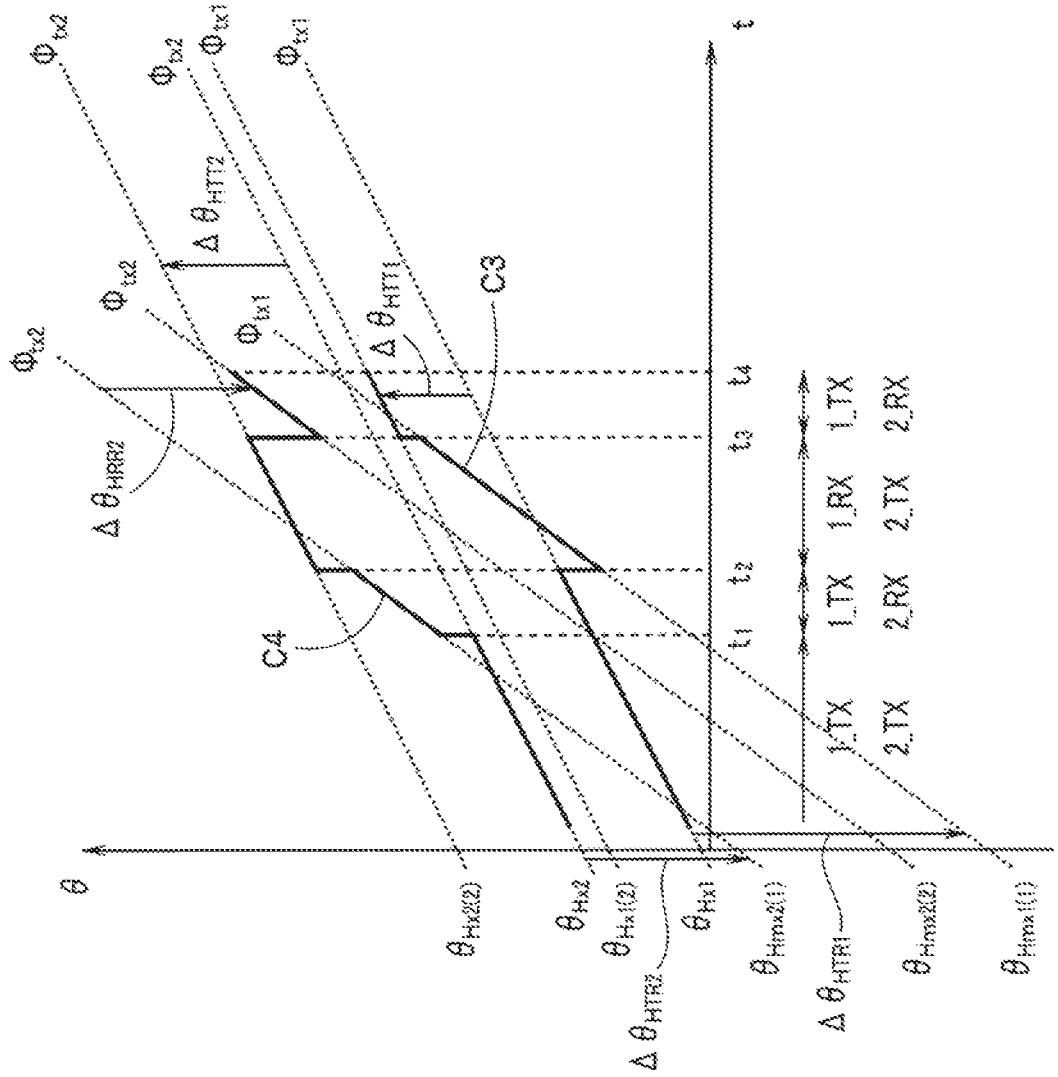
FIG. 8 is a diagram in which arrows explaining information on five kinds of phase differences are added to a graph similar to the graph of FIG. 4.

A graph in FIG. 8 shows a transition of the initial phases of the signals S2 and S5 in the distance measurement sequence of the high frequency, and explains five kinds of phase differences that are necessary for calculation of a first term in equation (36) described above, similarly to FIG. 7. FIG. 8 is a diagram in which arrows explaining information on the five kinds of phase differences are added to a graph similar to the graph in FIG. 4. Note that the graph in FIG. 8 illustrates an example having a characteristic of a same shape as the shape of the graph in FIG. 7 to simplify explanation, but does not have to have the characteristic of the same shape as in FIG. 7.

The initial phase of the signal S2 from mpl1 of the device 1 changes to an initial phase $\theta_{Hx1}$ before a time $t_2$, an initial phase $\theta_{Hmx1(1)}$ from the time $t_2$ to a time $t_3$, and an initial phase $\theta_{Hx1(2)}$ from the time $t_3$ to a time $t_4$. The initial phase of the signal S5 from mpl2 of the device 2 changes to an initial phase $\theta_{Hx2}$ before a time $t_1$, an initial phase $\theta_{Hmx2(1)}$ from the time $t_1$ to the time $t_2$, an initial phase $\theta_{Hx2(2)}$ from the time $t_2$ to the time $t_3$, and an initial phase $\theta_{Hmx2(2)}$ from the time $t_3$ to the time $t_4$.

Phase differences $\Delta\theta_{HTT1}$ and $\Delta\theta_{HTR1}$ are phase differences concerning the device 1. The phase difference $\Delta\theta_{HTT1}$ is a difference between the initial phase $\theta_{Hx1(2)}$ from the time $t_3$ to the time $t_4$ and the initial phase $\theta_{Hx1}$ before the time $t_2$ in the signal S2. The phase difference $\Delta\theta_{HTR1}$ is a difference between the initial phase $\theta_{Hmx1(1)}$ from the time $t_2$ to the time $t_3$ and the initial phase $\theta_{Hx1}$ before the time $t_2$ in the signal S2. Relationships among these variables can be respectively expressed by equation (43) and equation (44) as follows.

$$\theta_{Hx1(2)} = \theta_{Hx1} + \Delta\theta_{HTT1} \quad (43)$$

$$\theta_{Hmx1(1)} = \theta_{Hx1} + \Delta\theta_{HTR1} \quad (44)$$

Likewise, phase differences $\Delta\theta_{HTT2}$, $\Delta\theta_{HRR2}$, and $\Delta\theta_{HTR2}$ are phase differences concerning the device 2. The phase difference $\Delta\theta_{HTT2}$ is a difference between the initial phase $\theta_{Hx2(2)}$ from the time $t_2$ to the time $t_3$ and the initial phase $\theta_{Hx2}$ before the time $t_1$ in the signal S5. The phase difference $\Delta\theta_{HRR2}$ is a difference between the initial phase $\theta_{Hmx2(2)}$ from the time $t_3$ to the time $t_4$ and the initial phase $\theta_{Hmx2(1)}$ from the time $t_1$ to the time $t_2$ in the signal S5. The phase difference $\Delta\theta_{HTR2}$ is a difference between the initial phase $\theta_{Hmx2(1)}$ from the time $t_1$ to the time $t_2$ and the initial phase $\theta_{Hx2}$ before the time $t_1$ in the signal S5. Relationships among these variables can be respectively expressed by equation (45) to equation (47) as follows.

$$\theta_{Hx2(2)} = \theta_{Hx2} + \Delta\theta_{HTT2} \quad (45)$$

$$\theta_{Hmx2(1)} = \theta_{Hx2} + \Delta\theta_{HTR2} \quad (46)$$

$$\theta_{Hmx2(2)} = \theta_{Hmx2(1)} + \Delta\theta_{HRR2} = \theta_{Hx2} + \Delta\theta_{HTR2} + \Delta\theta_{HRR2} \quad (47)$$

As in the case of the low frequency, of the above phase differences, $\Delta\theta_{HTT1}$, $\Delta\theta_{HTT2}$, and $\Delta\theta_{HRR2}$ can be directly measured by mpl1 and mpl2. On the other hand, $\Delta\theta_{HTR1}$ in equation (44) and $\Delta\theta_{HTR2}$ in equation (46) cannot be directly measured. Therefore, in the present embodiment, mpl1 and mpl2 obtain $\Delta\theta_{HTR1}$ and $\Delta\theta_{HTR2}$ by measuring the phase differences relating to $\Delta\theta_{HTR1}$ and $\Delta\theta_{HTR2}$ as will be described later.

Here, in order to show a concept of an initial phase measurement method, $\Delta\theta_{HRT1}$ and $\Delta\theta_{HTR2}$ will be described as measurable.

When equation (43) to equation (47) described above are substituted into $\theta_{HSUM}$ in equation (25) described above, $\theta_{HSUM}$ in equation (36) described above is given by equation (48) as follows.

$$\theta_{HSUM} = -2(\Delta\theta_{HTR1} + \Delta\theta_{HRT2}) + 2 \times \Delta\theta_{HTT2} + \Delta\theta_{HTT1} - \Delta\theta_{HRR2} \quad (48)$$

As above, it is possible to obtain the first term in equation (36) described above by equation (42) and equation (48) described above.

In thick line characteristics C1 to C4 in FIG. 7 and FIG. 8, sections where inclinations are small are transmission sections, and sections where inclinations are large are reception sections. Note that when one of the devices 1 and 2 is in the transmission section, the other one is in the reception section. In equation (42) and equation (48) described above, the phase differences $\Delta\theta_{LTT1}$, $\Delta\theta_{LTT2}$, $\Delta\theta_{HTT1}$, and $\Delta\theta_{HTT2}$ express the phase differences between the respective RF signals in the two transmission sections with the reception section sandwiched between the two transmission sections, in the respective devices 1 and 2. The phase differences $\Delta\theta_{LRR2}$, and $\Delta\theta_{HRR2}$ express the phase differences between the respective RF signals of the two reception sections with the transmission section sandwiched between the two reception sections. The phase differences $\Delta\theta_{LTR1}$, $\Delta\theta_{LTR2}$, $\Delta\theta_{HTR1}$ and $\Delta\theta_{HTR2}$ each express the phase difference between the respective RF signals of the continuous transmission section and reception section. The former two are the initial phase differences of the same frequency, and the latter two are the initial phase differences of different frequencies. When "the phase difference between the respective RF signals in the two transmission sections" (hereinafter, also referred to as a first phase difference), "the phase difference between the respective RF signals in the two reception sections" (hereinafter, also referred to as a second phase difference), and "the phase difference between the respective RF signals in the continuous transmission section and reception section" (hereinafter, also referred to as a third phase difference) can be obtained, it becomes possible to perform accurate distance measurement by equation (36) described above.

In the present embodiment, the three kinds of phase differences or information for obtaining the three kinds of phase differences are obtained by mpl1 and mpl2. Information concerning the obtained phase differences is outputted to the operation devices CA1 and CA2 by mpl1 and mpl2 respectively. The operation devices CA1 and CA2 are respectively given signals S12 and S9 from IFMIX1 and IFMIX2, and detect phases of the signals S12 and S9. The operation device CA1 performs an operation of equation (36) described above to obtain the delay $\tau_R$ and further obtains the distance R, by using phase information obtained from the signal S12 and information concerning the phase difference from mpl1. Note that in the device 2, the operation device CA2 can also perform an operation of equation (36) described above to obtain the delay $\tau_R$ and further obtain the distance R, by using phase information obtained from the signal S9 and the information concerning the phase difference from mpl2. Note that the operation devices CA1 and CA2 can respectively perform various kinds of control concerning distance measurement in the devices 1 and 2, for example, frequency setting, timing control and the like in the distance measurement sequence.

Specific Configuration

Figure 9:
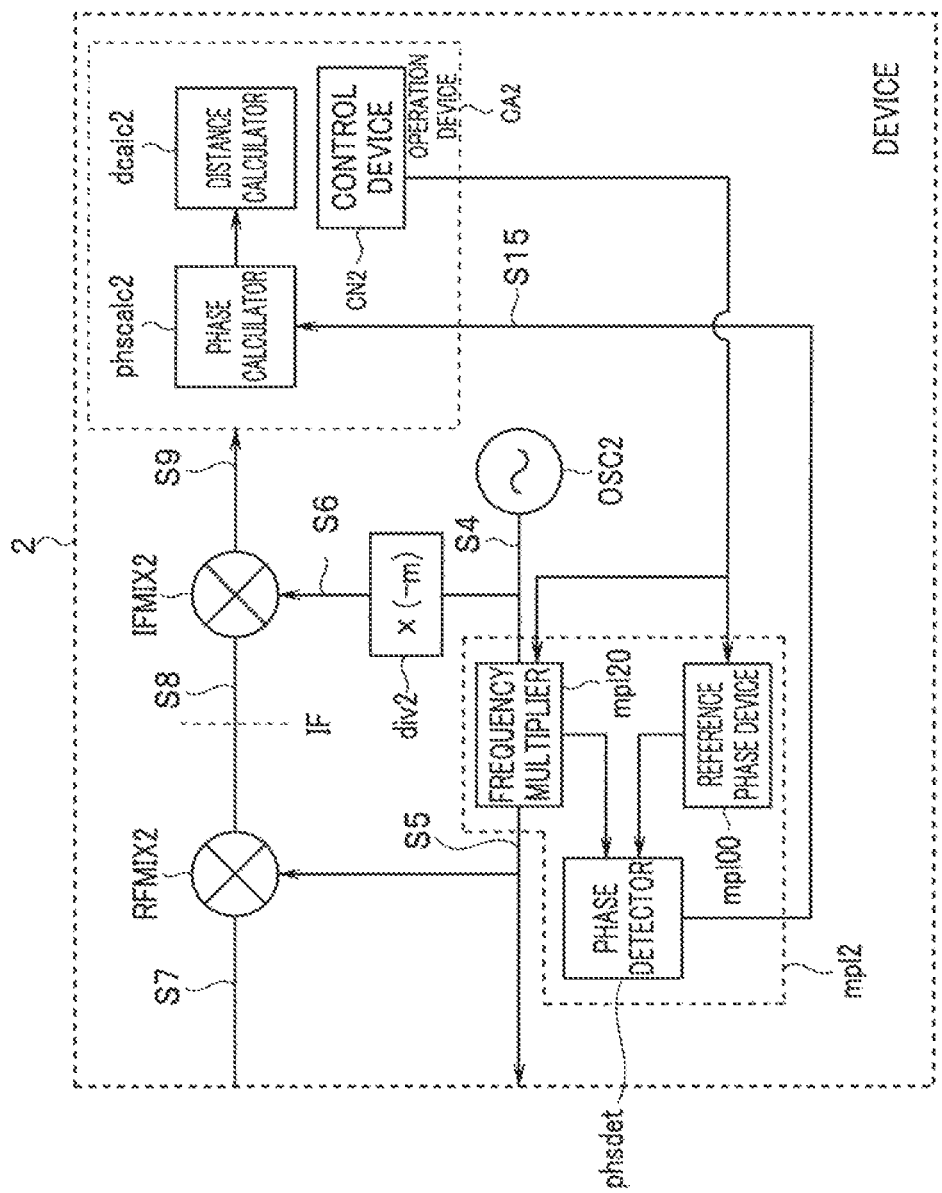
FIG. 9 is a block diagram illustrating the distance measuring device including the phase fluctuation detecting device and the phase correcting device according to the embodiment.

FIG. 9 is a block diagram illustrating the distance measuring device including the phase fluctuation detecting device and the phase correcting device according to the embodiment, and illustrates a specific configuration of mpl2 that calculates the information concerning the above described three kinds of phase differences in the device 2. Further, the configuration of mpl1 of the device 1 is also similar to the configuration in FIG. 9, and illustration and explanation will be omitted. Note that in FIG. 9, the phase fluctuation detecting device is mainly configured by OSC2 and mpl2, and the phase correcting device is configured by OSC2, mpl2, a phase calculator phscalc2, and a distance calculator dcalc2. As described above, it is possible to use the phase fluctuation detecting device and the phase correcting device not only in the distance measuring device, but also in various devices that detect phases of inputted signals, and in that case, in the phase correcting device, other circuits that correct the phase of the input signal according to the fluctuation amount of the initial phase by using the output of mpl2 are adopted, instead of the phase calculator phscalc2 and the distance calculator dcalc2.

A frequency multiplier mpl20, a reference phase device mpl00, and a phase detector phsdet configure mpl2. The frequency multiplier mpl20 has a same function as the function of mpl2A in FIG. 2. In other words, the frequency multiplier mpl20 configures a local oscillator, is given a signal S4 that is an oscillation output of OSC2, multiplies a frequency of the signal S4 by a predetermined amount, generates and outputs the signal S5 that is a local oscillation signal. Note that a multiplication number by the frequency multiplier mpl20 is designated by a control device CN2 of the operation device CA2. The control device CN2 generates frequency control data for determining the multiplication number of the frequency multiplier mpl20.

The signal S5 is given to RFMIX2 as an LO signal in the reception section of the distance measurement, and is transmitted as the single wave signal in the transmission section of the distance measurement. The frequency multiplier mpl20 can also output information on a phase of the signal S5 to the phase detector phsdet.

The reference phase device mpl00 is given the frequency control data from the control device CN2. As described above, in the distance measurement sequence, a frequency of the signal S5 from the frequency multiplier mpl20 changes, and an initial phase of the signal S5 also changes at a timing of a change of the frequency. In the present embodiment, the reference phase device mpl00 is given frequency control data (hereinafter, referred to as reference frequency control data) before an oscillation frequency of the frequency multiplier mpl20 is changed. Thereby, the reference phase device mpl00 can output information on a phase that changes according to the initial phase and an initial frequency before the frequency of the signal S5 from the frequency multiplier mpl20 is changed, that is, a phase for obtaining the reference phase (hereinafter, referred to as a quasi-reference phase). The reference phase device mpl00 outputs the obtained quasi-reference phase to the phase detector phsdet.

The phase detector phsdet acquires information for obtaining the above described three kinds of phase differences based on the inputted information, and outputs the information (S15) to the operation device CA2.

The operation device CA2 is configured by a phase calculator phscalc2, a distance calculator dcalc2 and a control device CN2. The control device CN2 controls operations of the phase calculator phscalc2 and the distance calculator dcalc2 that configure a correction circuit, and controls mpl2 and div2. The control device CN2 is capable of frequency control, timing control and the like concerning distance measurement in the device 2, and can also set the aforementioned frequency control data, for example.

The phase calculator phscalc2 obtains $\theta_{LSUM}$ and $\theta_{HSUM}$ of equation (36) described above to output $\theta_{LSUM}$ and $\theta_{HSUM}$ to the distance calculator dcalc2, by using the output of the phase detector phsdet. The operation device CA2 is also given a signal S9 from IFMIX2, and the distance calculator dcalc2 obtains the delay $\tau_R$ by an operation of equation (36) described above from the output of the phase calculator phscalc2 and the signal S9, and further calculates the distance R.

Figure 10:
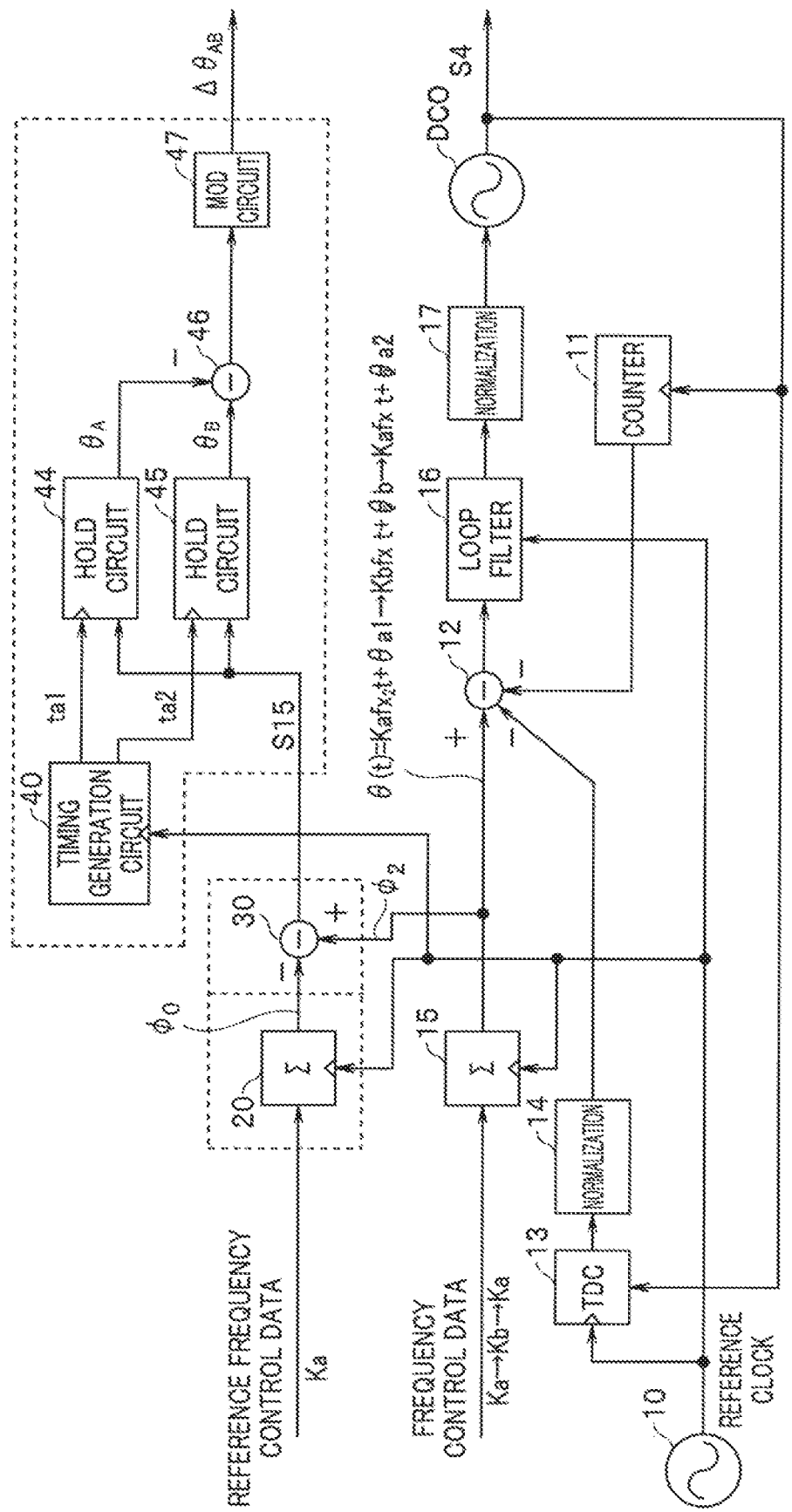
FIG. 10 is a circuit diagram illustrating a more specific configuration of part of mpl2 and a phase calculator phscalc2.

FIG. 10 is a circuit diagram illustrating a more specific configuration of part of mpl2 and the phase calculator phscalc2. Note that a configuration of part of mpl1 and the phase calculator phscalc1 of the device 1 is also similar to the configuration in FIG. 10, and illustration and explanation will be omitted.

A frequency multiplier mpl20 includes a circuit part of a frequency multiplier of an ordinary configuration including an ADPLL (all digital phase-locked loop) including a digitally controlled oscillator (DCO). The digitally controlled oscillator DCO generates an oscillation output of an oscillation frequency corresponding to an inputted digital value and outputs the oscillation output. As will be described later, at a time of lock of the ADPLL, the digitally controlled oscillator DCO generates an oscillation output of a frequency that is a rational multiple of a frequency of the reference clock that is generated by the reference oscillator 10. Note that the reference oscillator 10 corresponds to OSC2 in FIG. 1 and FIG. 9.

The oscillation output of the digitally controlled oscillator DCO is supplied to a counter 11. The counter 11 counts the oscillation output of the digitally controlled oscillator DCO, and a count value of the counter 11 is outputted to a subtractor 12. The counter 11 counts a number of waves (number of pulses) of the oscillation output of the digitally controlled oscillator DCO. A count value of the counter 11 in one period of the reference clock indicates how many integer multiples of the reference clock, for example, the oscillation output of the digitally controlled oscillator DCO is.

The oscillation output of the digitally controlled oscillator DCO is also supplied to TDC13. TDC13 may be configured by a plurality of delay elements of a delay time sufficiently shorter than the period of the oscillation output. TDC13 is also given the reference clock, and TDC13 obtains a delay time (corresponding to a phase difference) between the oscillation output of the digitally controlled oscillator DCO and the reference clock, and outputs the delay time to a normalization circuit 14. The normalization circuit 14 normalizes the output of TDC13 with one period of the reference clock as 1. In other words, an output of the normalization circuit 14 indicates that how many decimal multiples of the reference clock period the output (delay time) of TDC13 is, and indicates the phase difference between the output of the digitally controlled oscillator DCO and the reference clock. The output of the normalization circuit 14 is supplied to the subtractor 12.

An integrator ($\Sigma$) 15 is given frequency control data and the reference clock. The frequency control data indicates a multiplication number of a rational number to the reference clock, which is a value of a ratio of a desired oscillation output frequency of the digitally controlled oscillator DCO and a reference clock frequency. The integrator 15 integrates the frequency control data at each reference clock, and outputs an integration result to the subtractor 12.

An output of the counter 11 is an integration result of an integer multiplication number of the frequency of the output of the digitally controlled oscillator DCO to the reference clock, and the output of the normalization circuit 14 is a decimal multiplication number of the frequency of the output of the digitally controlled oscillator DCO to the reference clock. The outputs of the counter 11 and the normalization circuit 14 each indicate a multiplication number of a rational number of the frequency of the output of the digitally controlled oscillator DCO that is oscillating to the reference clock. The outputs of the counter 11 and the normalization circuit 14 each indicate a present phase of the output of the digitally controlled oscillator DCO with the reference clock as a reference.

The subtractor 12 obtains a phase error by subtracting the outputs of the counter 11 and the normalization circuit 14 from an output of the integrator 15. The subtractor 12 gives the obtained phase error to the digitally controlled oscillator DCO via a loop filter 16 and a normalization circuit 17. Thereby, the oscillation output of the digitally controlled oscillator DCO changes in frequency so that an output of the subtractor 12 becomes zero. Note that the loop filter 16 operates at reference clock periods, and the normalization circuit 17 normalizes an output of the loop filter 16 to information suitable for frequency control of the digitally controlled oscillator DCO and gives the information to the digitally controlled oscillator DCO. In this way, at a time of lock of the ADPLL, an oscillation output of a frequency of a rational number multiple based on the frequency control data of the reference clock is obtained from the digitally controlled oscillator DCO.

As described above, the outputs of the counter 11 and the normalization circuit 14 each indicate the present phase of the output of the digitally controlled oscillator DCO with the reference clock as a reference, the output of the counter 11 indicates a present phase of an integer multiple of $2\pi$ (360 degrees), and the output of the normalization circuit 14 indicating a decimal multiplication number indicates a present phase at a time of the output of the digitally controlled oscillator DCO with the reference clock as the reference being normalized by $2\pi$, that is, setting $2\pi$ as 1. At the time of lock, the output of the subtractor 12 becomes zero, so that the output of the integrator 15 also indicates a present phase of the output of the digitally controlled oscillator DCO with the reference clock as the reference.

The output of the integrator 15 is also outputted to a subtractor 30.

An integrator ($\Sigma$) 20 configures the reference phase device mpl00 in FIG. 9. The integrator 20 is given reference frequency control data. The integrator 20 is also given the reference clock from the reference oscillator 10. The integrator 20 integrates the reference frequency control data at each reference clock, and outputs an integration result to the subtractor 30, similarly to the integrator 15. The reference frequency control data is data of an initial value before the frequency control data that is supplied to the integrator 15 is changed.

In other words, the integrator 20 can output information on a phase that changes according to an initial phase and an initial frequency before the frequency of the signal S5 from the frequency multiplier mpl20 being changed, that is, a phase for obtaining a reference phase (hereinafter, referred to as a quasi-reference phase).

The phase detector phsdet in FIG. 9 is configured by the subtractor 30, and a part of the phase calculator phscalc2 in FIG. 9 is configured by a timing generation circuit 40, hold circuits 44 and 45, a subtractor 46, and a MOD (remainder operation) circuit 47. The subtractor 30 subtracts an output of the integrator 20 from the output of the integrator 15, and outputs a subtraction result to the hold circuits 44 and 45. When a phase indicated by the output of the integrator 15 (hereinafter, referred to as an output phase of the integrator 15) is set as $\phi_2$, and a phase indicated by the output of the integrator 20 (hereinafter, referred to as an output phase of the integrator 20) is set as $\phi_0$, the subtractor 30 obtains a difference between $\phi_2$ and $\phi_0$. Note that in the present description, $\phi_2$ and $\phi_0$ are treated as signals obtained by normalizing $2\pi$ to 1 on the circuit.

The output phase (quasi-reference phase) of the integrator 20 is a phase that changes at a similar change rate to a change rate of the reference phase and matches in initial phase or differs only in initial phase with or from the phase (reference phase) of the output of the frequency multiplier mpl20 at the time of the initial setting, that is, the output phase of the integrator 15. Accordingly, when the frequency control data that is inputted to the integrator 15 is not changed from an initial value, the frequency control data and the reference frequency control data have same values as each other, and an output of the subtractor 30 becomes 0 or a predetermined fixed value and does not change.

For example, it is assumed that when the frequency of the reference oscillator 10 is $f_{x2}$ and the frequency control data of the initial value is $K_a$, the output phase $\theta$ (t) of the integrator 15 is expressed by $\theta$ (t)=$K_a f_{x2} t + \theta_{a1}$. $\theta_{a1}$ is an initial phase in this case. In this case, the output phase $\theta_0$ (t) of the integrator 20 is expressed by $\theta_0$ (t)=$K_a f_{x2} t + \theta_0$. $\theta_0$ is an initial phase in this case. In this case, the output of the subtractor 30 is $\theta_{a1} - \theta_0$, and is a fixed value.

When the frequency control data that is supplied to the integrator 15 changes to $K_b$, the output phase $\theta$ (t) of the integrator 15 becomes $\theta$ (t)=$K_b f_{x2} t + \theta_b$. Note that $\theta_b$ is an initial phase in this case, and the output of the subtractor 30 changes to $K_b f_{x2} t + \theta_b - (K_a f_{x2} t + \theta_0)$. When the frequency control data returns to $K_a$, the output phase $\theta$ (t) of the integrator 15 becomes $\theta$ (t)=$K_a f_{x2} t + \theta_{a2}$. Note that $\theta_{a2}$ is an initial phase in this case, and the output of the subtractor 30 changes to $\theta_{a2} - \theta_0$.

In this way, the output of the subtractor 30 corresponds to the change in the frequency and the initial phase, and it is possible to remove an influence by the initial phase by using the output of the subtractor 30. When applied to the distance measuring device, the output of the subtractor 30 is supplied to the hold circuits 44 and 45 that configure a part of the phase calculator phscalc2, as information S15 for acquiring the aforementioned first to third phase differences.

The output of the integrator 15 corresponds to the output phase of the digitally controlled oscillator DCO, and corresponds to the phase $\phi_{tx2}$ shown by the thick line characteristics C2 and C4 in FIG. 7 and FIG. 8. When illustrated with $\theta_0 = \theta_{a1}$ for easy understanding of the relationship, the output phase (quasi-reference phase) of the integrator 20 corresponds to a straight line of the phase $\phi_{tx2}$ shown by a dashed line with $\theta_{Lx2}$ or $\theta_{Hx2}$ in FIG. 7 and FIG. 8 as an initial phase. The output of the subtractor 30 is a difference between the thick line characteristic C2 in FIG. 7 and FIG. 8 and the quasi-reference phase expressed by a straight line.

The timing generation circuit 40 is given the reference clock and generates predetermined timing signals ta1 and ta2 to output the timing signals ta1 and ta2 to the hold circuits 44 and 45, with the reference clock as a reference.

Figure 11:
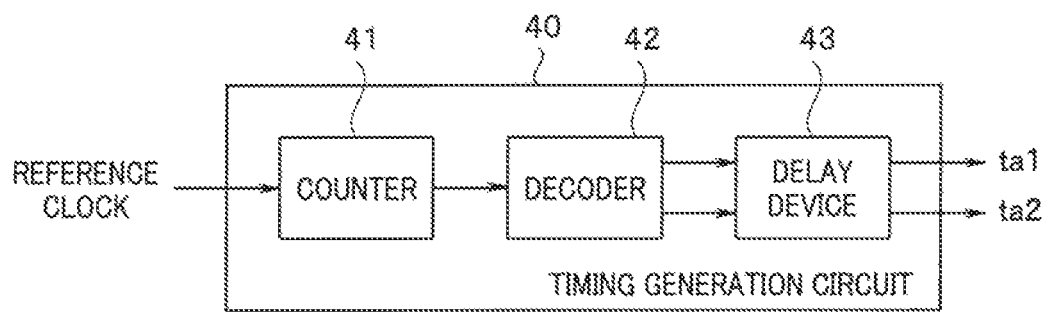
FIG. 11 is a block diagram illustrating one example of a specific configuration of a timing generation circuit 40.

FIG. 11 is a block diagram illustrating one example of a specific configuration of the timing generation circuit 40. The timing generation circuit 40 is configured by a counter 41, a decoder 42 and a delay device 43. The counter 41 counts the reference clock to output a count value to the decoder 42. The decoder 42 generates two timing signals corresponding to the count value to output the two timing signals to the delay device 43 by being controlled by the control device CN2 of the operation device CA2 (not illustrated), or based on information stored in a memory not illustrated. The delay device 43 generates the timing signals ta1 and ta2 by delaying the inputted two timing signals by a predetermined delay time. Note that the timing signals ta1 and ta2 will be described later.

The hold circuit 44 outputs a phase $\theta_A$ acquired by holding an output of the subtractor 30 at timing of the timing signal ta1 to the subtractor 46. The hold circuit 45 outputs a phase $\theta_B$ acquired by holding an output of the subtractor 30 at timing of the timing signal ta2 to the subtractor 46. Note that the timing generation circuit 40 sets times at which the output frequency of the frequency multiplier mpl20 is stabilized in the reception section and the transmission section as the timings ta1 and ta2.

The subtractor 46 performs subtraction of the phases $\theta_A$ and $\theta_B$, and outputs a subtraction result to the MOD circuit 47. As described later, the aforementioned first to third phase differences can be obtained from the subtraction result of the subtractor 46. For example, it is obvious that $\Delta\theta_{LT2}$ in FIG. 7 is easily obtained based on an output of the subtractor 46.

FIG. 7 and FIG. 8 show that the phase $\phi_{tx2}$ shown by the thick line characteristic C2 and the quasi-reference phase simply increase, but in reality, the phase does not exceed $2\pi$. The MOD circuit 47 obtains a remainder by $2\pi$ of the output of the subtractor 46, and outputs $\Delta\theta_{AB}$ that is information on a phase difference. A distance measurement operation is performed by using $\Delta\theta_{AB}$.

When $2\pi$ is treated as 1 as in the present embodiment, the MOD circuit 47 can be a circuit that takes out only a decimal portion from an inputted signal. Alternatively, the integrator 20, the subtractor 30, the hold circuit 44, the hold circuit 45, the subtractor 46 and the like may be made the circuits that handle only decimal portions, without the MOD circuit 47 being provided, and it is obvious that a circuit scale can be reduced by doing so.

Figure 12:
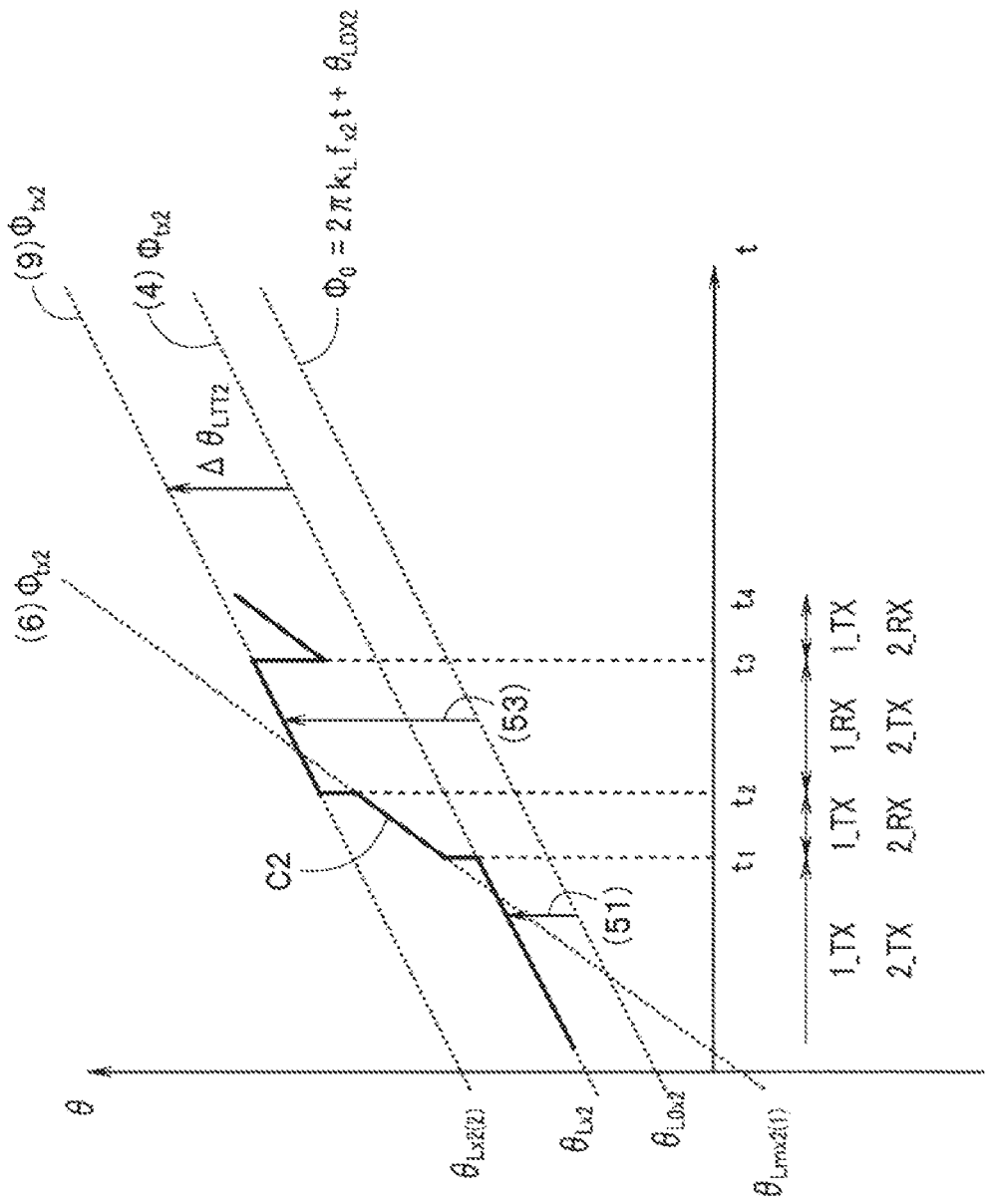
FIG. 12 is a graph by a similar description method to a description method of the graph in FIG. 7.

Next, an operation of the embodiment that is configured in this way will be described with reference to a graph in FIG. 12. FIG. 12 is a graph by a similar description method to the description method in FIG. 7, in which the characteristics concerning the device 1 (device 1A) is removed from the graph in FIG. 7, and shows an output phase (quasi-reference phase) of the integrator 20 that configures the reference phase device mpl00 by $\phi_0$. It is assumed that mpl2 operates similarly to mpl2A of the device 2A. In other words, the phase of the output of mpl2 of the device 2, that is, the output phase $\phi_2$ of the integrator 15 is shown by FIG. 12 (characteristic C2) showing a similar characteristic to the characteristic of FIG. 7. Note that the integrator 15 and the integrator 20 operate discretely at each period of a reverse number of a frequency $f_{x2}$ of the reference oscillator 10, and therefore, strictly speaking, output phases of the integrators change stepwise. The graph in FIG. 12 has a staircase shape when it is enlarged enough, but in this case, the graph is expressed such that stairs are omitted for the sake of intuitive understanding. The same applies to the following graphs. In the present description, to make the explanation easier to understand, in the following equations and explanations, explanation is performed for a behavior at each time at which $f_{x2} t$ or $f_{x1} t$ becomes an integer, that is, at each discrete time will be described.

It is assumed that the reference phase device mpl00 and mpl20 have the same frequency at the time of the initial setting of the transmission frequency before the time $t_1$, and a similar initial setting to the initial setting of mpl2A described above is performed. Accordingly, the output phase $\phi_2$ of the integrator 15 indicating a phase $\phi_{tx2}$ of the output of mpl20 is equivalent to a right side of equation (4) described above, and is expressed by a thick line characteristic C2 in FIG. 12. In mpl20, $k_L$ in equation (4) means a rational number indicated by frequency control data $K_a$. An integer value (integer multiplication number) of the rational number corresponds to a multiple of 360° ($2\pi$) in phase conversion, and is omitted in a remainder operation for obtaining the phase difference $\Delta\theta_{AB}$. Therefore, in using the output phase $\phi_2$ of the integrator 15 corresponding to the phase $\phi_{tx2}$ of the output of mpl20, it is not necessary to consider the integer multiplication number, and only a change in the phase by a decimal value (decimal multiplication number) may be used, though it is a repetition of the above. Note that in the following explanation, the right side of equation (4) including a phase amount by the integer multiplication number is directly used, but there is no particular problem.

Calculation of First Phase Difference

The phase $\phi_2$ of the output of the integrator 15 is given by equation (49) as follows that is similar to the right side of equation (4).

$$\phi_2 = 2\pi k_L f_{x2} t + \theta_{Lx2} \tag{49}$$

In the reference phase device mpl00, a frequency setting in the initial setting is same as the frequency setting in the initial setting of mpl20, but an initial phase does not have to be same as the initial phase of mpl20. When the initial phase at the time of a low frequency of the reference phase device mpl00 is $\theta_{L0x2}$, a quasi-reference phase $\phi_0$ of the output of the integrator 20 that is obtained from the output of the reference phase device mpl00 is given by equation (50) as follows.

$$\phi_0 = 2\pi k_L f_{x2} t + \theta_{L0x2} \tag{50}$$

Handling of the integer multiplication number is similar to the case of $\phi_2$, and the integer multiplication number is assumed to be included in equation (50). When $\phi_2 - \phi_0$ is detected in the subtractor 30 immediately before the time $t_1$ at which the frequency is switched, $$\phi_2 - \phi_0 = \theta_{Lx2} - \theta_{L0x2} \tag{51}$$

is established, and a difference between the initial phase of the frequency multiplier mpl20 and the initial phase of the reference phase device mpl00 in the initial setting is obtained.

As described above, in the device 2, a period from the time $t_1$ to the time $t_2$ is the reception section, and there is the transmission section again after the time $t_2$, so that an output frequency of the frequency multiplier mpl20 changes, and the initial phase of the output of the digitally controlled oscillator DCO also changes. The phase $\phi_2$ of the output of the integrator 15 from the time $t_2$ to a time $t_3$ is given by equation (52) as follows that is similar to a right side of equation (9) described above.

$$\phi_2 = 2\pi k_L f_{x2} t + \theta_{Lx2(2)} \tag{52}$$

The quasi-reference phase $\phi_0$ of the output of the integrator 20 that is the output of the reference phase device mpl00 follows equation (50) described above, because the frequency setting is not changed in the reference phase device mpl00. Accordingly, when $\phi_2 - \phi_0$ is detected by the subtractor 30 at a time at which the frequency is stabilized in the transmission section from the time $t_2$ to the time $t_3$, equation (53) as follows is obtained.

$$\phi_2 - \phi_0 = \theta_{Lx2(2)} - \theta_{L0x2} \tag{53}$$

A difference between $\phi_2 - \phi_0$ that is detected immediately before the time $t_1$ and $\phi_2 - \phi_0$ that is detected at the time when the frequency is stabilized in the transmission section from the time $t_2$ to the time $t_3$ shows a phase difference $\Delta\theta_{LTT2}$ that is a change in the initial phase due to a change in the output frequency of the frequency multiplier mpl20. In other words, equation (51) is subtracted from equation (53), whereby $\theta_{Lx2(2)} - \theta_{Lx2}$ is obtained, and this is $\Delta\theta_{LTT2}$.

Processing of the above will be described with a circuit operation. Now, the phases of the frequency multiplier mpl20 and the reference phase device mpl00 that are detected at a time $t_A$ immediately before the time $t_1$ are respectively set as $\phi_2(t_A)$, and $\phi_0(t_A)$, and the phases of the frequency multiplier mpl20 and the reference phase device mpl00 that are detected at a time $T_B$ between the time $t_2$ and the time $t_3$ are respectively set as $\phi_2(t_B)$, and $\phi_0(t_B)$.

The timing generation circuit 40 sets the time $t_A$ immediately before the time $t_1$ as the timing ta1, and sets the time $t_B$ between the time $t_2$ and the time $t_3$ as the timing ta2. Thereby, the hold circuit 45 outputs a phase $\phi_B = \phi_2(t_B) - \phi_0(t_B)$, and the hold circuit 44 outputs $\theta_A = \phi_2(t_A) - \phi_0(t_A)$.

In this way, the subtractor 46 obtains $\theta_B - \theta_A$. In other words, the output of the subtractor 46 is $\Delta\theta_{LTT2}$ that is expressed by equation (54) as follows.

$$\text{Phase difference } \Delta\theta_{LTT2} = \phi_2(t_B) - \phi_0(t_A) - \{\phi_2(t_A) - \phi_0(t_A)\} \tag{54}$$

In this way, $\Delta\theta_{LTT2}$ that is a change in the initial phase of the frequency multiplier mpl20, that is, the first phase difference ("the phase difference between the respective RF signals in the two transmission sections") is outputted from the subtractor 46. For the output of the subtractor 46, a remainder of $2\pi$ is obtained by the MOD circuit 47. Thereby the MOD circuit 47 outputs $\Delta\theta_{LTT2}$ as $\Delta\theta_{AB}$.

Note that from a MOD circuit 47 of the device 1 not illustrated, $\Delta\theta_{LTT1}$ is obtained by a method similar to the above described method.

Calculation of Second Phase Difference

Figure 13:
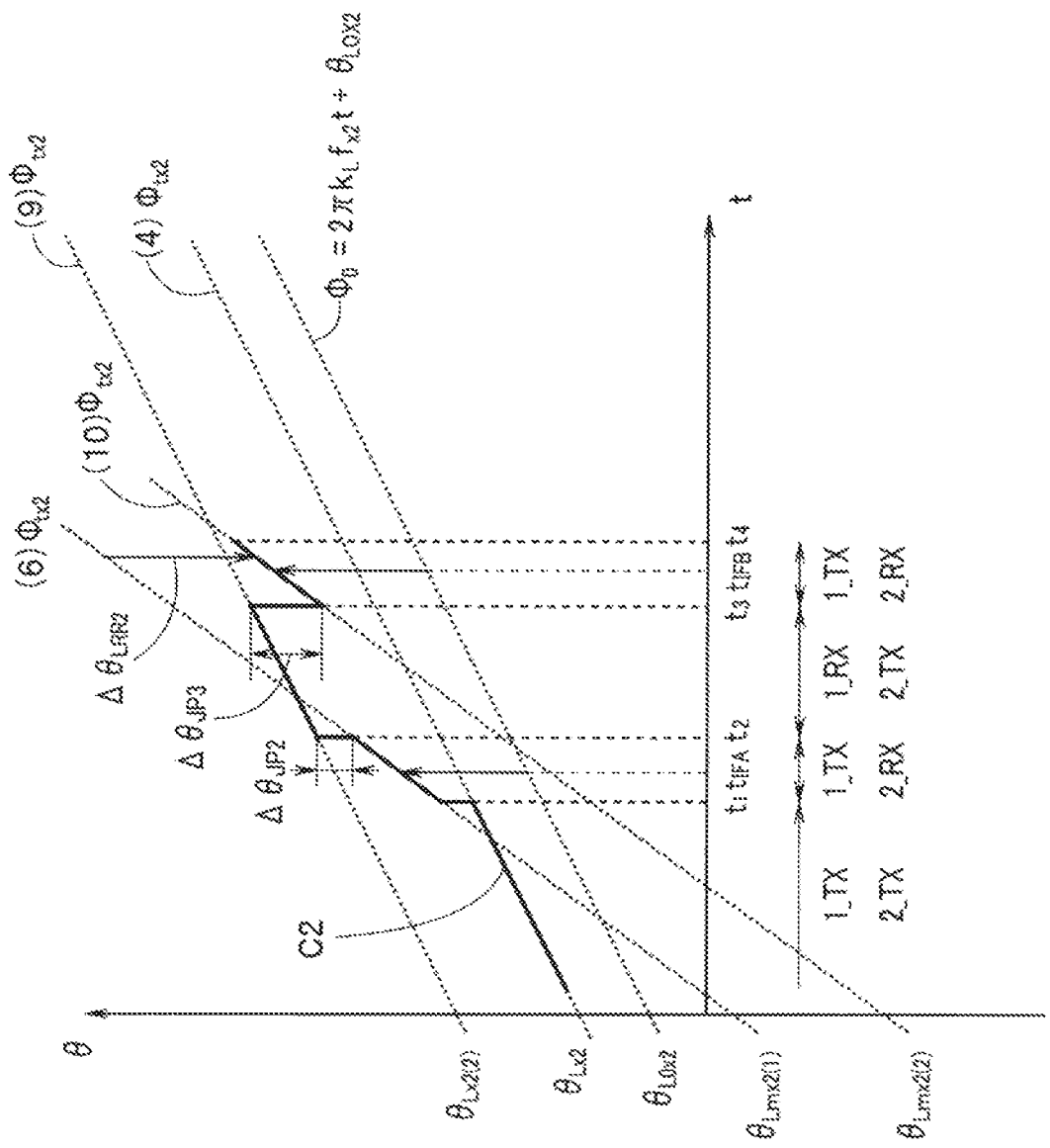
FIG. 13 is a similar graph to the graph in FIG. 12.

Next, with reference to FIG. 13, FIG. 14 and FIG. 15, a method for detecting the "the phase difference between the respective RF signals in the two reception sections" that is the second phase difference will be described. FIG. 13 is a similar graph to the graph in FIG. 12. In other words, in FIG. 13, the characteristic concerning the device 1 (device 1A) is removed from the graph in FIG. 7, and FIG. 13 shows the output phase (quasi-reference phase) $\phi_0$ of the integrator 20 that is the output of the reference phase device mpl00. It is assumed that mpl2 operates similarly to mpl2A of the device 2A. In other words, a phase of the output of mpl2 of the device 2, that is, the output phase $\phi_2$ of the integrator 15 is shown by a characteristic C2 in FIG. 13.

The phase $\phi_{Lx2}(t)$ of an LO signal from the frequency multiplier mpl20 in the reception section of the device 2 from the time $t_3$ to the time $t_4$ is obtained from the output of the integrator 15. The output phase $\phi_2(t)$ of the integrator 15 in this case is expressed by equation (55) as follows that is similar to a right side of equation (10) described above.

$$\phi_2(t) = \phi_{Lx2}(t) = 2\pi(k_L + m)f_{x2}t + \phi_{Lmx2(2)} \tag{55}$$

Here, $\theta_{Lmx2(2)}$ is an initial phase of the output signal S5 of mpl20 in a section from a time $t_3$ to a time $t_4$. An initial phase of the output signal S5 of mpl20 in a section from a time $t_1$ to a time $t_2$ is set as $\theta_{Lmx2(1)}$, a phase jump amount at a time of the device 2 transitions from reception to transmission is set as $\Delta\theta_{JP2}$, and a phase jump amount at a time of the device 2 transitioning from transmission to reception is set as $\Delta\theta_{JP3}$. If there is no change in the frequency, a total of the phase jump amounts $\Delta\theta_{JP2}$ and $\Delta\theta_{JP3}$ is equal to a difference between $\theta_{Lmx2(2)}$ and $\theta_{Lmx2(1)}$, and when the frequency change is taken into consideration, a relationship between $\theta_{Lmx2(2)}$ and $\theta_{Lmx2(1)}$ is expressed by equation (56) as follows.

$$\theta_{Lmx2(2)} - \theta_{Lmx2(1)} = -mf_{x2} \times (t_3 - t_2) + \Delta\theta_{JP2} + \Delta\theta_{JP3} \tag{56}$$

Figure 14:
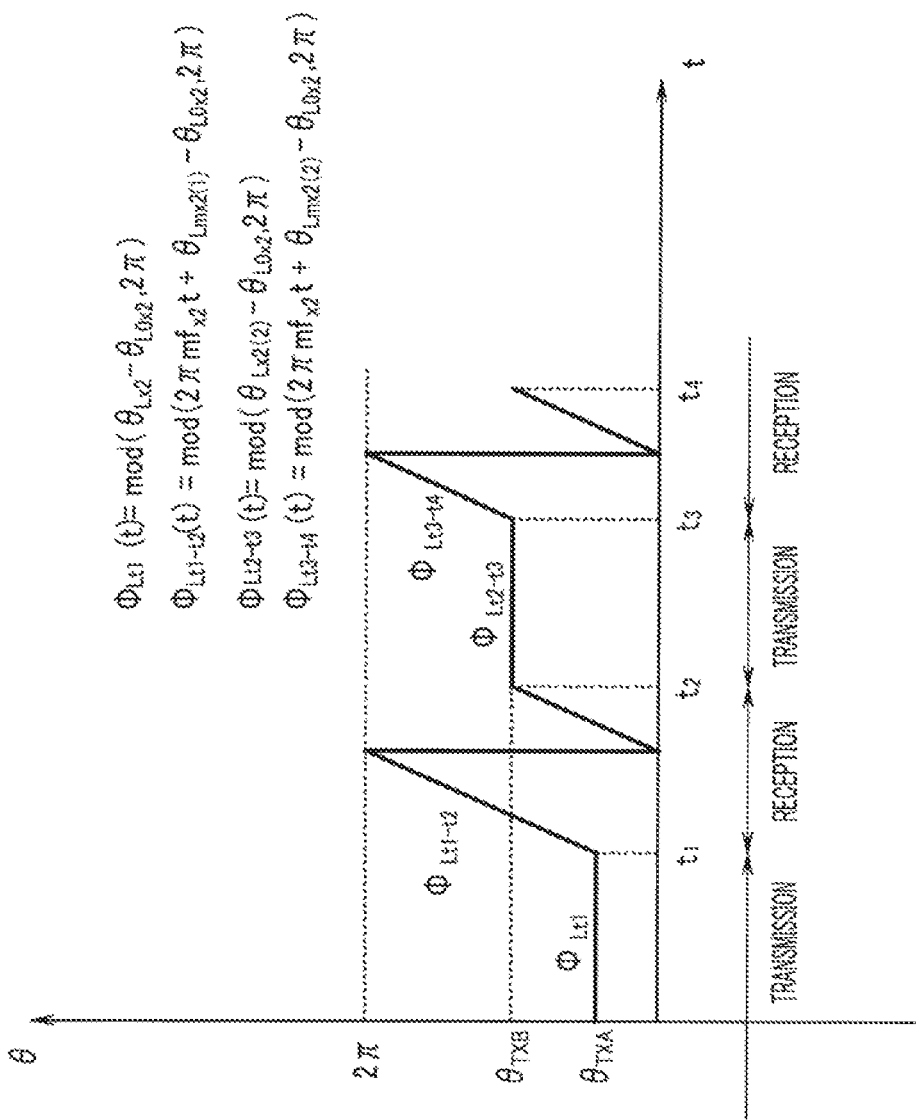
FIG. 14 is an explanatory diagram for explaining a difference between a phase $\phi_{ix2}$ of mpl20 and a quasi-reference phase $\phi_0$ obtained from an output of a reference phase device mpl00.

FIG. 14 is an explanatory diagram for explaining a difference between a phase $\phi_{tx2}$ of mpl20 and a quasi-reference phase $\phi_0$ from the reference phase device mpl00.

FIG. 14 shows a value obtained by performing remainder calculation of $2\pi$ for a phase difference between the phase $\phi_{tx2}$ ($\phi_2$) and the quasi-reference phase $\phi_0$ in a vertical axis. Note that the remainder is applied to simplify explanation of a phase difference detection method of a reception state. To simplify the explanation, $\Delta\theta_{JP2}=\Delta\theta_{JP3}=0[\text{rad}]$ is set.

In other words, a waveform in FIG. 14 shows a change in $\phi_2$ in a case of the quasi-reference phase $\phi_0$ being set as a reference. When a phase in a transmission state (initial setting state) before a time t1 is set as $\phi_{Lt1}(t)$, a phase in a reception section from the time $t_1$ to a time $t_2$ is set as $\phi_{Lt1-t2}(t)$, a phase in a transmission section from the time $t_2$ to a time $t_3$ is set as $\phi_{Lt2-t3}(t)$, and a phase in a reception section from the time $t_3$ to a time $t_4$ is set as $\phi_{Lt3-t4}(t)$, waveforms showing the phase differences in the respective sections in FIG. 14 can be respectively expressed by equation (57) to equation (60) as follows, as seen from FIG. 13. Note that an IF frequency $f_{IF2}$ of the device 2 is a frequency difference $mf_{x2}[\text{Hz}]$ between an LO signal at a transmission time and an LO signal at a reception time, and equation (61) as follows is established.

$$\phi_{Lt1}(t)=\text{mod}(\theta_{Lx2}-\theta_{Lox2}, 2\pi)=\theta_{TXA} \quad (57)$$

$$\phi_{Lt1-t2}(t)=\text{mod}(2\pi mf_{x2}t+\theta_{Lmx2(1)}-\theta_{Lox2}, 2\pi)=\text{mod}(2\pi f_{IF2}t+\theta_{Lmx2(1)}-\theta_{Lox2}, 2\pi) \quad (58)$$

$$\phi_{Lt2-t3}(t)=\text{mod}(\theta_{Lx2(2)}-\theta_{Lox2}, 2\pi)=\theta_{TXB} \quad (59)$$

$$\phi_{Lt3-t4}(t)=\text{mod}(2\pi mf_{x2}t+\theta_{Lmx2(2)}-\theta_{Lox2}, 2\pi)=\text{mod}(2\pi f_{IF2}t+\theta_{Lmx2(2)}-\theta_{Lox2}, 2\pi) \quad (60)$$

$$f_{IF2}=mf_{x2} \quad (61)$$

As shown in FIG. 14, a phase difference between the phase of the output of mpl20 and the quasi-reference phase is constant in the transmission sections, and changes at a change rate of an IF angular frequency ($2\pi mf_{x2}$) in the reception sections. Here, a case where the reception state does not end at the time $t_2$, and reception is continued until the time $t_4$ is considered. In this case, equation (58) described above is also applied to a section from the time $t_2$ to the time $t_4$.

Figure 15:
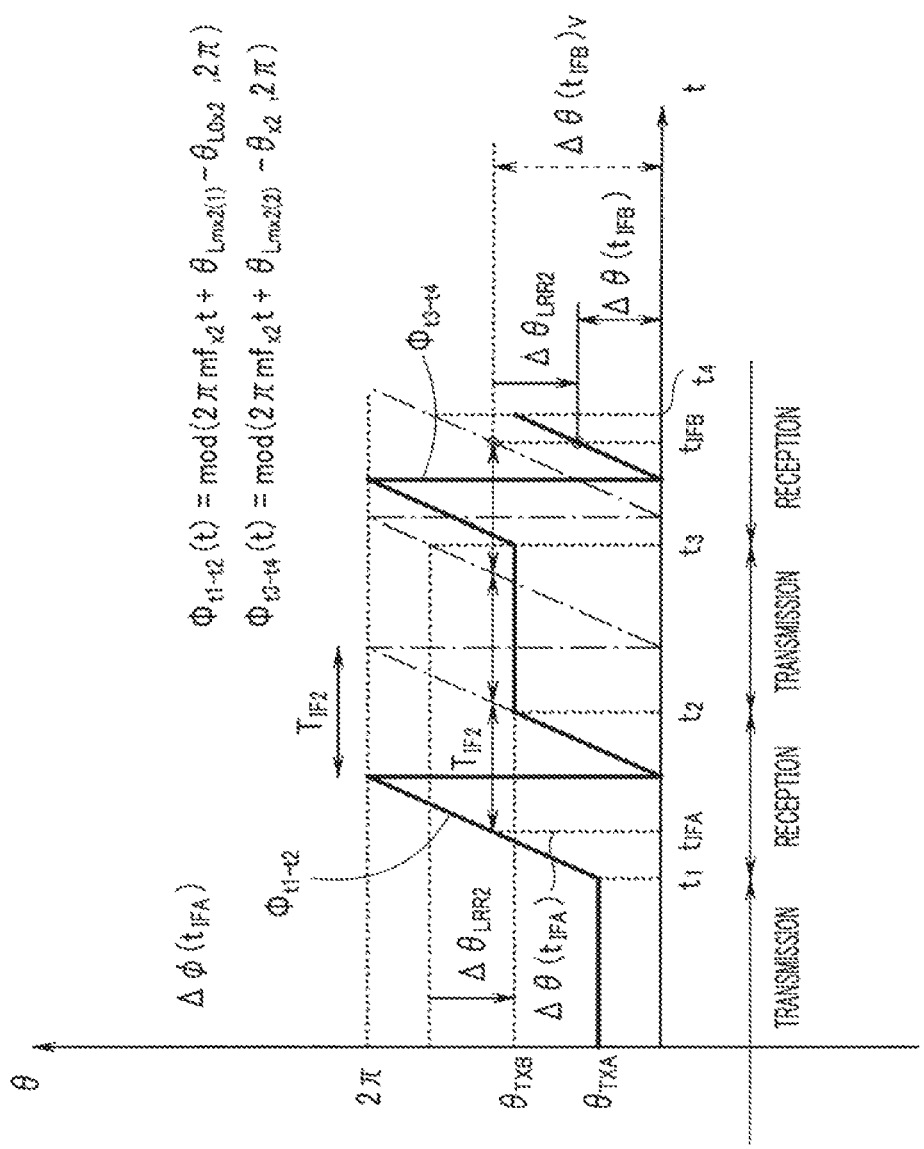
FIG. 15 is an explanatory diagram illustrating a waveform of a phase difference in FIG. 14 by adding a waveform of a phase difference to which equation (58) is applied to the waveform of the phase difference in FIG. 14 by a dash-dotted line.

FIG. 15 is an explanatory diagram illustrating waveforms of phase differences to which equation (58) is applied by adding the waveforms by a dash-dotted line to the waveforms of the phase differences in FIG. 14. A time period (one period) $T_{IF2}$ in which the phase changes from 0[rad] to $2\pi[\text{rad}]$ is 1/IF frequency, that is, $$T_{IF2}=1/f_{IF2} \quad (62).$$

When an arbitrary time when the frequency is stabilized in the reception section from a time $t_1$ to a time $t_2$ is set as $t_{IFA}$, if reception of the signal of the frequency $f_{IF2}$ is continued thereafter, the phase of the output of mpl20 has a same value at each time period $T_{IF2}$, as shown by the dash-dotted line in FIG. 15. In other words, a phase difference between the phase of the output of mpl20, the frequency of which is assumed not to change and the quasi-reference phase has a same value at each time period $T_{IF2}$ from the time $t_{IFA}$.

Accordingly, when a difference between the output phase $\phi_2$ of the integrator 15 that indicates the output phase of mpl20 and the quasi-reference phase $\phi_0$ is obtained in the subtractor 30, if a time $t_{IFB}$ is assumed to be a time after an integer multiple of $T_{IF2}$ from the time $t_{IFA}$, in the section from a time $t_3$ to a time $t_4$ in FIG. 15, and a phase difference between the output phase of mpl20 detected at the time $t_{IFB}$ and the quasi-reference phase is set as $\Delta\theta(t_{IFB})v$ (dashed line), a phase difference $\Delta\theta(t_{IFA})$ and the phase difference $\Delta\theta(t_{IFB})v$ (dashed line) have a same value.

However, since the frequency changes in the reception section from a time $t_2$ to the time $t_3$ in reality, the phase of the output of mpl20 changes according to equation (60), and the phase difference $\Delta\theta(t_{IFB})$ at the time $t_{IFB}$ has a different value from the value of the phase difference $\Delta\theta(t_{IFA})$.

The difference of the phase differences in the case of receiving the frequency change and the case of not receiving the frequency change in the section from the time $t_2$ to the time $t_3$ is due to the fact that the initial phase changes with the frequency change in the section from the time $t_2$ to the time $t_3$ because there is no change in the frequency in the two reception sections. In other words, an initial phase fluctuation amount $\Delta\theta_{LRR2}=\Delta\theta(t_{IFB})-\Delta\theta(t_{IFB})v$ is established. In the operation, the quasi-reference phase is cancelled out, and therefore, the initial phase fluctuation amount $\Delta\theta_{LRR2}$ is obtained by equation (63) as follows using $\phi_{Lt2-t4}(t_{IFB})$ that is the output phase $\phi_2$ of the integrator 15 at the time $t_{IFB}$, and $\phi_{Lt1-t2}(t_{IFA})$ that is the output phase $\phi_2$ of the integrator 15 at the time $t_{IFA}$.

$$\Delta\theta_{LRR2}=\phi_{Lt3-t4}(t_{IFB})-\phi_{Lt1-t2}(t_{IFA}) \quad (63)$$

Note that equation (63) described above is obtained by setting both the phase jumps $\Delta\theta_{JP2}$, and $\Delta\theta_{JP3}$ as 0[rad]. However, as is obvious from FIG. 13, the phase $\phi_{Lt3-t4}(t_{IFB})$ reflects $\Delta\theta_{JP2}+\Delta\theta_{JP3}$, and even when the phase jumps $\Delta\theta_{JP2}$, and $\Delta\theta_{JP3}$ are not 0[rad], an initial phase fluctuation amount $\Delta\theta_{LRR2}$ is obtained by equation (63) described above.

In other words, in the present embodiment, the timing generation circuit 40 sets the time $t_{IFA}$ as the timing signal ta1, and sets the time $t_{IFB}$ as the timing signal ta2. The hold circuit 44 outputs 42 $\phi_2-\phi_0$ at the time $t_{IFA}$ as $\theta_A$, and the hold circuit 45 outputs $\phi_2-\phi_0$ at the time $t_{IFB}$ as $\theta_B$.

The subtractor 46 calculates the fluctuation amount $\Delta\theta_{LRR2}$ of the initial phase based on $\theta_B-\theta_A$. The MOD circuit 47 takes a remainder by $2\pi$ of the output of the subtractor 46, and outputs the fluctuation amount $\Delta\theta_{LRR2}$ as $\Delta\theta_{AB}$. In this way, it is possible to detect "the phase difference between the respective RF signals of the two reception sections" that is the second phase difference.

Note that the initial phase fluctuation amount $\Delta\theta_{LRR2}$ is also obtained by an operation of a difference between the output of the integrator 15 at the time $T_{IFA}$ in the first reception section, and the output of the integrator 15 at the time $t_{IFB}$ in the second reception section after a time period that is an integer multiple of $T_{IF2}$ from the time $t_{IFA}$.

Note that from the MOD circuit 47 of the device 1 not illustrated, $\Delta\theta_{LRR1}$ is obtained by a similar method to the method described above.

Calculation of Third Phase Difference

Next, with reference to FIG. 16, a method for detecting the "phase difference between the respective RF signals in the transmission section and the reception section that are continuous" that is the third phase difference will be described. FIG. 16 is a similar explanatory diagram to the diagram in FIG. 14. Note that the third phase difference is phase differences $\Delta\theta_{LTR1}$, $\Delta\theta_{LTR2}$, $\Delta\theta_{HTR1}$, and $\Delta\theta_{HTR2}$ in FIG. 7 and FIG. 8. Of the phase differences, the phase difference $\Delta\theta_{LTR2}$ concerning transition from the section before the time $t_1$ of the device 2 to the reception section from the time $t_1$ to the time $t_2$ will be described as an example hereinafter, but as for the other cases, the phase differences can be similarly obtained.

FIG. 16 is a diagram illustrating a phase difference between the quasi-reference phase $\phi_0$ and the output phase $\phi_2$ of the integrator 15 indicating the output phase of the frequency multiplier mpl20 in the device 2 by applying a remainder of $2\pi$ by a similar method to the method in FIG. 14. Hereinafter, explanation will be performed by setting sample points at a time $t_C$ before the time $t_1$ and a time $t_D$ after the time $t_1$.

A phase difference detected at the time $t_C$ is $\mathrm{mod}(\theta_{Lx2}-\theta_{Lox2}, 2\pi)$ as shown in equation (57) described above. A phase difference detected at the time $t_D$ is $$\phi_{Lt1-t2}(t_D)=\mathrm{mod}(2\pi f_{IF2}t_D+\theta_{Lmx2(1)}-\theta_{Lox2}, 2\pi) \quad (64)$$

from equation (58). When the equation is simplified to omit mod, the phase detected at the time $t_C$ is set as $\phi_{Lt1}(t_C)$, and a difference between the two phase differences given from equation (58) and equation (64) is taken, equation (65) as follows is obtained.

$$\phi_{Lt1-t2}(t_D)-\phi_{Lt1}(t_C)=2\pi f_{IF2}t_D+\theta_{Lmx2(1)}-\theta_{Lx2} \quad (65)$$

From equation (40) and equation (65) described above, equation (66) as follows is obtained.

$$\Delta\theta_{LTR2}=\theta_{Lmx2(1)}-\theta_{Lx2}=\phi_{Lx2}=\phi_{Lt1-t2}(t_D)-\phi_{Lt1}(t_C)-2\pi f_{IF2}t_D \quad (66)$$

From the output of the subtractor 30, $\phi_{Lt1-t2}(t_D)$ and $\phi_{Lt2}(t_C)$ in equation (66) described above are obtained. Accordingly, when the IF frequency $f_{IF2}$ and the time $t_D$ are defined, $\Delta\theta_{LTR2}$ can be obtained from equation (66) described above.

Note that equation (66) described above is obtained with a phase jump at a time of transition from a section before the time $t_1$ to a section from the times $t_1$ to $t_2$ set as 0 [rad]. However, as is obvious from FIG. 13, the phase $\phi_{Lt1-t2}(t_D)$ at the time $t_D$ reflects the phase jump, and even when the phase jump is not 0 [rad], the initial phase fluctuation amount $\Delta\theta_{LTR2}$ is obtained by equation (66) described above.

In other words, in the present embodiment, the IF frequency $f_{IF2}$ and the time $t_D$ in the first reception section are defined, and the timing generation circuit 40 sets the time $t_C$ in the output section by the initial setting as the timing signal ta1, and sets the time $t_D$ as the timing signal ta2. The hold circuit 44 obtains $\phi_2-\phi_0$ at the time $t_C$ as the phase $\theta_A$, and the hold circuit 45 obtains $\phi_2-\phi_0$ at the time $t_D$ as the phase $\theta_B$.

The subtractor 46 obtains the initial phase fluctuation amount $\Delta\theta_{LTR2}$ based on $\theta_B-\theta_A$. The MOD circuit 47 obtains the remainder by $2\pi$ of the output of the subtractor 46, and outputs the fluctuation amount $\Delta\theta_{LTR2}$ of the initial phase as a phase difference $\Delta\theta_{AB}$.

Note that by an operation including a difference between $\phi_2-\phi_0$ at the time $t_C$ and $\phi_2-\phi_0$ at the time $t_D$, the initial phase fluctuation amount $\Delta\theta_{LTR2}$ can also be detected.

From the MOD circuit 47 of the device 1 not illustrated, $\Delta\theta_{LTR1}$ is obtained by a similar method to the method described above.

Next, $\Delta\theta_{HTR2}$ is obtained. The distance measurement sequence of the low frequency and the distance measurement sequence of the high frequency in FIG. 3 only differ in frequency and start time of the sequence, and the time sequences in transmission and reception are same. It is assumed that the reference phase device mpl00 and mpl20 have a same frequency at the times of the initial settings after the time $t_4$ and before $D+t_1$ as in the content described in

[0099] In other words, when a difference in frequency is ignored, the phase difference between the quasi-reference phase of the device 2 and the output phase of the integrator 15 indicating the phase of the output of the frequency multiplier mpl20 can be expressed by a similar waveform to the waveform in FIG. 16 in the distance measurement sequence of the high frequency, and with respect to a sequence start time t=0 [s] of the low frequency, the start time can be offset by t=D [s] in the sequence of the high frequency.

Accordingly, equations in which L expressing the meaning of the low frequency is changed to H expressing the meaning of the high frequency and the detection time of the phase is changed from the time $t_D$ to the time $D+t_D$ and is changed from the time $t_C$ to the time $D+t_C$ in equation (64) to equation (66) described above are established.

In other words, $\Delta\theta_{HTR2}$ can be expressed by equation (67) as follows that is obtained by transforming equation (66) described above by setting the phase of the output of the frequency multiplier mpl20 at the time $D+t_D$ as $\phi_{Ht1-t2}(D+t_D)$ and by setting the phase of the output of the frequency multiplier mpl20 at the time $D+t_C$ as $\phi_{Ht1}(D+t_C)$.

$$\Delta\theta_{HTR2}=\theta_{Hmx2(1)}-\theta_{Hx2}=\phi_{Ht1-t2}(D+t_D)-\phi_{Ht1}(D+t_C)-2\pi f_{IF2}t_D \quad (67)$$

Note that the IF frequency of the device 2 hardly changes whether the IF frequency is at a high frequency or at a low frequency, final terms of equation (66) and equation (67) have a same value.

In equation (67) described above, $\phi_{Hft1-t2}(D+t_D)$ and $\phi_{Ht1}(D+t_C)$ in equation (67) described above are obtained by the outputs of the subtractor 30. Accordingly, when the IF frequency $f_{IF2}$ and the time $t_D$ are defined, $\Delta\theta_{HTR2}$ can be obtained from equation (66) described above. Equation (67) is established regardless of a size of a phase jump at a time of transition from the section before the time $t_1$ to the section from the times $D+t_1$ to $D+t_2$.

In other words, in the present embodiment, the IF frequency $f_{IF2}$ and the time $t_D$ in the first reception section are defined, and the timing generation circuit 40 sets the time $D+t_C$ in the output section by the initial setting as the timing signal ta1, and sets the time $D+t_D$ as the timing signal ta2. The hold circuit 44 obtains $\phi_2-\phi_0$ at the time $D+t_C$ as the phase $\theta_A$, and the hold circuit 45 obtains $\phi_2-\phi_0$ at the time $D+t_D$ as the phase $\theta_B$. The subtractor 46 obtains the initial phase fluctuation amount $\Delta\theta_{HTR2}$ by $\theta_B-\theta_A$. The MOD circuit 47 obtains the remainder by $2\pi$ of the output of the subtractor 46, and outputs the initial phase fluctuation amount $\Delta\theta_{HTR1}$ as the phase difference $\Delta\theta_{AB}$.

Note that it is also possible to calculate the fluctuation amount $\Delta\theta_{HTR1}$ based on a difference between an output of the integrator 15 at the time $D+t_C$, and an output of the integrator 15 at the time $D+t_D$.

From the MOD circuit 47 of the device 1 not illustrated, $\Delta\theta_{HTR1}$ is obtained by a similar method to the method described above.

In this way, it is possible to detect the "phase difference between the respective RF signals in the transmission section and the reception section that are continuous" that is the third phase difference. The phase calculator phscalc2 and the distance calculator dcalc2 of the device 2 performs a distance measurement operation by using the obtained first to third phase differences, that is, the initial phase fluctuation amounts.

Distance Measurement Calculation

The $\theta_{LSUM}$ in equation (36) described above can be calculated by using the first to the third phase differences as shown in equation (42) described above. Likewise, the $\theta_{HSUM}$ in equation (36) described above can also be calculated by using the first to the third phase differences as shown in equation (48) described above. The phase calculator phscalc2 outputs $\theta_{LSUM}$ and $\theta_{HSUM}$ that are calculated to the distance calculator dcalc2. The distance calculator dcalc2 obtains the delay $\tau_R$ by the operation of equation (36) described above from the output of the phase calculator phscalc2 and the signal S9, and further calculates a distance R.

Although the subtractor 30 is described as performing the operation of the IF frequency $f_{IF2}$ and the time $t_D$ at the time of calculation of the above described third phase difference, the operation can be omitted as will be shown as follows. Equation (68) as follows expresses $\theta_{LSUM}-\theta_{HSUM}$ in the first term of equation (36) described above, from equation (42) and equation (48).

$$\theta_{LSUM}-\theta_{HSUM}=-2(\Delta\theta_{LTR1}-\Delta\theta_{HTR1})-2(\Delta\theta_{LTR2}-\Delta\theta_{HTR2})+2(\Delta\theta_{LTT2}-\Delta\theta_{HTT2})+(\Delta\theta_{LTT1}-\Delta\theta_{HTT1})-(\Delta\theta_{LRR2}-\Delta\theta_{HRR2}) \quad (68)$$

A first term and a second term of equation (68) each show "the phase difference between the respective RF signals in the transmission section and the reception section that are continuous" that is the third phase difference, a third term and a fourth term each show "the phase difference between the respective RF signals in the two transmission sections" that is the first phase difference, and a fifth term shows "the phase difference between the respective RF signals in the two reception sections" that is the second phase difference. In other words, the second term is a difference between "the phase difference between the respective RF signals in the transmission section and the reception section that are continuous" using the low frequency and "the phase difference between the respective RF signals in the transmission section and the reception section that are continuous" using the high frequency, in the device 2. When a difference between equation (66) and equation (67) is taken in order to obtain the difference, equation (69) as follows is obtained.

$$\Delta\theta_{LTR2}-\Delta\theta_{HTR2}=\phi_{Lt1-t2}(t_D)-\phi_{Lt1}(t_C)-\{\phi_{Ht1-t2}(D+t_D)-\phi_{Ht1}(D+t_C)\} \quad (69)$$

In equation (69), the terms of the operation of the IF frequency $f_{IF2}$ and the time $t_D$ are cancelled out. In other words, it shows that when the predetermined time $t_D$ with the frequency setting start as the reference is set at a fixed value, the difference in the "phase difference of the respective RF signals in the transmission section and the reception section that are continuous" that is the third phase difference can be obtained by the subtractor 30 only obtaining the difference of the output phases of the integrators 15 and 20.

In the device 1, it is also possible to obtain $\Delta\theta_{LTR1}-\Delta\theta_{HRT1}$ of the first term by a similar method.

Accordingly, in this case, the phase calculator phscalc2 can calculate $\theta_{LSUM}-\theta_{HSUM}$ by using an operation result of the subtractor 30, and output a calculation result to the distance calculator dcalc2.

Note that as is obvious from FIG. 16, in the case where the frequency is not stabilized at the time $t_D$, the phase can be sampled at a time $t_D+T_{IF2}$ that is delayed by the IF period.

In the explanation so far, calculation of the first phase difference, calculation of the second phase difference, and calculation of the third phase difference are described with separate timings. It is necessary to obtain $\phi_{Lt2-t3}(t)-\phi_{Lt1}(t)$ in the calculation of the first phase difference, $\phi_{Lt3-t4}(t_{IFB})-\phi_{Lt1-t2}(t_{IFA})$ in the calculation of the second phase difference, and $\phi_{Lt1-t2}(t_D)-\phi_{Lt1}(t_C)$ or the like in the calculation of the third phase difference. Since these calculations are in parallel with one another in terms of time, the phase calculator phscalc2 can obtain the respective values by including a plurality of sets of the timing generation circuits 40, the hold circuits 44 and 45, the subtractors 46 and the MOD circuits 47.

Here, the case of performing the above described circuit by one set as in FIG. 10 is considered. it is assumed that the hold circuit 44 holds $\phi_{Lt1}(t_C)$, the hold circuit 45 holds a value three times, and the subtractor 46 and the MOD circuit 47 output $\Delta\theta_{AB}$ that is a result of subtracting the value of $\phi_{Lt1}(t_C)$ held by the hold circuit 44 from the subtractor 46 and the MOD circuit 47 to the distance calculator dcalc2 three times. When phases at the three times of holding are set as $\phi_{Lt1-t2}(t_{IFA})$, $\phi_{Lt2-t3}(t)$, and $\phi_{Lt3-t4}(t_{IFB})$ in a time sequence, and $\Delta\theta_{AB}$ at the respective phases are set as $\Delta\theta_{AB1}$, $\Delta\theta_{AB2}$, and $\Delta\theta_{AB3}$, $\Delta\theta_{AB1}$, $\Delta\theta_{AB2}$, and $\Delta\theta_{AB3}$ can be expressed by equations (70) to (72). Note that the equations are expressed by being simplified and having mod omitted.

$$\Delta\theta_{AB1}=\phi_{Lt1-t2}(t_{IFA})-\phi_{Lt1}(T_C) \quad (70)$$

$$\Delta\theta_{AB2}=\phi_{Lt2-t3}(t)-\phi_{Lt1}(t_C) \quad (71)$$

$$\Delta\theta_{AB3}=\phi_{Lt3-t4}(t_{IFB})-\phi_{Lt1}(t_C) \quad (72)$$

When $\Delta\theta_{AB3}-\Delta\theta_{AB1}$ is calculated here, equation (73) is obtained.

$$\Delta\theta_{AB3}-\Delta\theta_{AB1}=\phi_{Lt3-t4}(t_{IFB})-\phi_{Lt1-t2}(t_{IFA}) \quad (73)$$

When the equations are looked at here, it is found that equation (71) corresponds to the calculation of the first phase difference, equation (73) corresponds to the calculation of the second phase difference, and equation (70) corresponds to the calculation of the third phase difference in a case of $t_D=T_{IFA}$. Therefore, it is found that if equation (73) is calculated by the distance calculator dcalc2, a necessary phase difference can be obtained with the configuration in FIG. 10, and the distance can be calculated.

In this way, in the present embodiment, it is possible to achieve the similar function to the function in the case of not changing the initial phase, in the device that detects the phase of a signal by using the local oscillator by obtaining the fluctuation amount of the phase due to the initial phase change and the frequency change by adopting the reference phase device for obtaining the reference phase and obtaining the difference between the quasi-reference phase obtained from the output of the reference phase device and the phase of the output after resetting of the frequency, and correcting the phase according to the obtained fluctuation amount.

For example, when the present embodiment is applied to a distance measuring device that performs transmission and reception of single wave signals between devices and performs distance measurement from a reception phase, and is a distance measuring device using a direct modulation method for a transmission unit and using a super heterodyne method for a reception unit, a fluctuation amount of an initial phase following a frequency change in a distance measurement sequence can be detected and corrected, and therefore accurate distance measurement is possible from phase information.

Note that the present invention is not limited to the above described embodiment, and can be modified variously in the range without departing from the gist of the present invention in the implementation stage. The above described embodiment includes the inventions in various stages, and various inventions can be extracted by appropriate combinations in the plurality of components that are disclosed. For example, even when some components are deleted from all the components shown in the embodiment, the configuration from which the components are deleted can be extracted as the invention when the problem described in the column of the problem to be solved by the invention can be solved, and the effect described in the column of the effect of the invention is obtained.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A phase correcting device, comprising:
   a local oscillator that includes an all digital phase-locked loop configured to generate a local oscillation signal based on a reference clock, and is configured to give the local oscillation signal to a device configured to detect a phase of an inputted signal;
   a first phase detector included in the all digital phase-locked loop, and configured to detect a phase of the local oscillation signal to output the phase of the local oscillation signal;
   a reference phase device configured to generate a quasi-reference phase corresponding to a reference phase of the local oscillation signal at a time of an initial setting of the local oscillator to output the quasi-reference phase, based on the reference clock;
   a second phase detector configured to detect a fluctuation amount of a phase of the local oscillator, based on the phase detected by the first phase detector and the quasi-reference phase; and
   a correction circuit configured to correct the phase of the inputted signal by using a detection result of the second phase detector.

2. The phase correcting device according to claim 1, wherein the first phase detector includes a first integrator configured to be given frequency control data for designating a multiplication number of the local oscillation signal, and
   the reference phase device includes a second integrator configured to be given frequency control data for designating a multiplication number of the local oscillation signal at the time of the initial setting of the local oscillator.

3. The phase correcting device according to claim 2, wherein the second phase detector includes a first subtractor configured to obtain a difference between an output of the first integrator and an output of the second integrator.

4. The phase correcting device according to claim 3, wherein the second phase detector comprises
   hold circuits configured to hold outputs of the first subtractor at predetermined two timings different from each other, and
   a second subtractor configured to obtain a difference between the outputs of the first subtractor that are held at the two timings.

5. The phase correcting device according to claim 1, wherein the all digital phase-locked loop comprises the first phase detector, a digital control oscillator configured to control a frequency by digital control based on frequency control data, a counter circuit and a time-digital conversion circuit configured to obtain a phase of the local oscillation signal from the digital control oscillator with a phase of the reference clock as a reference, and a subtractor configured to obtain a difference of outputs of the first phase detector that is given the frequency control data, and the counter circuit and the time-digital conversion circuit to control the digital control oscillator based on a difference result, and
   the first phase detector gives an output at a time of lock of the all digital phase-locked loop to the second phase detector as a detection result of the phase of the local oscillation signal.

6. A distance measuring device that calculates a distance based on carrier phase detection, comprising:
   an operation device configured to calculate a distance between a first device and a second device based on phase information acquired from the first device and the second device, at least one of the first device and the second device being movable,
   wherein the first device comprises
   a first local oscillator that includes a first all digital phase-locked loop configured to generate a first local oscillation signal based on a first reference clock, and is configured to output the first local oscillation signal,
   a first transmitter configured to transmit two or more first carrier signals by using an output of the first local oscillator by a direct modulation method,
   a first receiver configured to receive two or more second carrier signals by using an output of the first local oscillator by a heterodyne method,
   a first output phase detector included in the first all digital phase-locked loop, and configured to detect a phase of the first local oscillation signal to output the phase of the first local oscillation signal,
   a first reference phase device configured to generate a first quasi-reference phase corresponding to a first reference phase of the first local oscillation signal at a time of an initial setting of the first local oscillator to output the first quasi-reference phase, based on the first reference clock, and
   a first fluctuation phase detector configured to detect a first fluctuation amount of a phase of the first local oscillator, based on a phase detected by the first output phase detector and the first quasi-reference phase,
   the second device comprises
   a second local oscillator that includes a second all digital phase-locked loop configured to generate a second local oscillation signal based on a second reference clock, and is configured to output the second local oscillation signal,
   a second transmitter configured to transmit the two or more second carrier signals by using an output of the second local oscillator by a direct modulation method;
   a second receiver configured to receive the two or more first carrier signals by using an output of the second local oscillator by a heterodyne method,
   a second output phase detector included in the second all digital phase-locked loop, and configured to detect a phase of the second local oscillation signal to output the phase of the second local oscillation signal,
   a second reference phase device configured to generate a second quasi-reference phase corresponding to a second reference phase of the second local oscillation signal at a time of an initial setting of the second local oscillator to output the second quasi-reference phase, based on the second reference clock, and a second fluctuation phase detector configured to detect a second fluctuation amount of a phase of the second local oscillator, based on a phase detected by the second output phase detector, and the second quasi-reference phase, and the operation device performs calculation of the distance based on a phase detection result obtained by reception of the first carrier signal and the second carrier signal by the first receiver and the second receiver, and the first fluctuation amount and the second fluctuation amount detected by the first fluctuation phase detector and the second fluctuation phase detector.

7. A phase fluctuation detecting device, comprising:

a local oscillator that includes an all digital phase-locked loop configured to generate a local oscillation signal based on a reference clock, and is configured to give the local oscillation signal to a device configured to detect a phase of an inputted signal;

a first phase detector included in the all digital phase-locked loop, and configured to detect a phase of the local oscillation signal to output the phase of the local oscillation signal;

a reference phase device configured to generate a quasi-reference phase corresponding to a reference phase of the local oscillation signal at a time of an initial setting of the local oscillator to output the quasi-reference phase, based on the reference clock; and a second phase detector configured to detect a fluctuation amount of a phase of the local oscillator, based on a phase detected by the first phase detector and the quasi-reference phase.

8. A phase correction method, comprising:

giving a local oscillation signal to a device configured to detect a phase of an inputted signal, from a local oscillator including an all digital phase-locked loop configured to generate the local oscillation signal based on a reference clock;

detecting a phase of the local oscillation signal to output the phase of the local oscillation signal, by a first phase detector included in the all digital phase-locked loop;

generating a quasi-reference phase corresponding to a reference phase of the local oscillation signal at a time of an initial setting of the local oscillator to output the quasi-reference phase, based on the reference clock, by a reference phase device, detecting a fluctuation amount of a phase of the local oscillator based on a phase detected by the first phase detector and the quasi-reference phase by a second phase detector, and correcting the phase of the inputted signal by using a detection result of the second phase detector.

* * * * *